(12) United States Patent
Enquist et al.

(10) Patent No.: US 12,347,820 B2
(45) Date of Patent: Jul. 1, 2025

(54) STACKED DEVICES AND METHODS OF FABRICATION

(71) Applicant: ADEIA SEMICONDUCTOR BONDING TECHNOLOGIES INC., San Jose, CA (US)

(72) Inventors: Paul M. Enquist, Cary, NC (US); Belgacem Haba, Saratoga, CA (US)

(73) Assignee: ADEIA SEMICONDUCTOR BONDING TECHNOLOGIES INC., San Jose, CA (US)

( * ) Notice: Subject to any disclaimer, the term of this patent is extended or adjusted under 35 U.S.C. 154(b) by 56 days.

(21) Appl. No.: 18/507,478

(22) Filed: Nov. 13, 2023

(65) Prior Publication Data

US 2024/0088120 A1 Mar. 14, 2024

Related U.S. Application Data

(63) Continuation of application No. 17/586,236, filed on Jan. 27, 2022, now Pat. No. 11,916,054, which is a
(Continued)

(51) Int. Cl.
*H01L 25/18* (2023.01)
*H01L 21/768* (2006.01)
(Continued)

(52) U.S. Cl.
CPC ........ *H01L 25/18* (2013.01); *H01L 21/76898* (2013.01); *H01L 23/3171* (2013.01);
(Continued)

(58) Field of Classification Search
None
See application file for complete search history.

(56) References Cited

U.S. PATENT DOCUMENTS

| 4,998,665 A | 3/1991 | Hayashi |
| 5,019,673 A | 5/1991 | Juskey et al. |

(Continued)

FOREIGN PATENT DOCUMENTS

| CN | 103681646 | 3/2014 |
| CN | 104078414 A | 10/2014 |

(Continued)

OTHER PUBLICATIONS

Amirfeiz et al., "Formation of silicon structures by plasma-activated wafer bonding," Journal of The Electrochemical Society, 2000, vol. 147, No. 7, pp. 2693-2698.
(Continued)

*Primary Examiner* — Scott B Geyer
(74) *Attorney, Agent, or Firm* — Knobbe, Martens, Olson & Bear, LLP

(57) ABSTRACT

Stacked devices and methods of fabrication are provided. Die-to-wafer (D2W) direct-bonding techniques join layers of dies of various physical sizes, form factors, and foundry nodes to a semiconductor wafer, to interposers, or to boards and panels, allowing mixing and matching of variegated dies in the fabrication of 3D stacked devices during wafer level packaging (WLP). Molding material fills in lateral spaces between dies to enable fan-out versions of 3D die stacks with fine pitch leads and capability of vertical through-vias throughout. Molding material is planarized to create direct-bonding surfaces between multiple layers of the variegated dies for high interconnect density and reduction of vertical height. Interposers with variegated dies on one or both sides can be created and bonded to wafers. Logic dies and image sensors from different fabrication nodes and different wafer sizes can be stacked during WLP, or logic dies and high bandwidth memory (HBM) of different geometries can be stacked during WLP.

13 Claims, 13 Drawing Sheets

Related U.S. Application Data continuation of application No. 16/413,429, filed on May 15, 2019, now Pat. No. 11,276,676.

(60) Provisional application No. 62/671,917, filed on May 15, 2018.

(51) Int. Cl.
   *H01L 23/00* (2006.01)
   *H01L 23/31* (2006.01)
   *H01L 23/48* (2006.01)
   *H01L 25/00* (2006.01)
   *H01L 25/07* (2006.01)
   *H10D 84/03* (2025.01)
   *H10D 88/00* (2025.01)
   *H10F 39/00* (2025.01)

(52) U.S. Cl.
   CPC ............ *H01L 23/481* (2013.01); *H01L 24/09* (2013.01); *H01L 25/074* (2013.01); *H01L 25/50* (2013.01); *H10D 84/038* (2025.01); *H10D 88/01* (2025.01); *H10F 39/018* (2025.01); *H10F 39/026* (2025.01); *H10F 39/804* (2025.01); *H10F 39/8053* (2025.01); *H10F 39/8063* (2025.01); *H10F 39/809* (2025.01); *H10F 39/811* (2025.01); *H01L 2224/02379* (2013.01); *H01L 2924/1431* (2013.01); *H01L 2924/1434* (2013.01)

(56) References Cited

U.S. PATENT DOCUMENTS

| | | |
|---|---|---|
| 5,051,802 A | 9/1991 | Prost et al. |
| 5,087,585 A | 2/1992 | Hayashi |
| 5,322,593 A | 6/1994 | Hasegawa et al. |
| 5,729,896 A | 3/1998 | Dalal et al. |
| 5,753,536 A | 5/1998 | Sugiyama et al. |
| 5,771,555 A | 6/1998 | Eda et al. |
| 5,854,507 A | 12/1998 | Miremadi et al. |
| 5,956,605 A | 9/1999 | Akram et al. |
| 5,985,739 A | 11/1999 | Plettner et al. |
| 5,998,808 A | 12/1999 | Matsushita |
| 6,008,126 A | 12/1999 | Leedy |
| 6,049,124 A | 4/2000 | Raiser et al. |
| 6,080,640 A | 6/2000 | Gardner et al. |
| 6,121,688 A | 9/2000 | Akagawa |
| 6,265,775 B1 | 7/2001 | Seyyedy |
| 6,374,770 B1 | 4/2002 | Lee |
| 6,410,983 B1 | 6/2002 | Moriizumi et al. |
| 6,423,640 B1 | 7/2002 | Lee et al. |
| 6,465,892 B1 | 10/2002 | Suga |
| 6,500,694 B1 | 12/2002 | Enquist |
| 6,582,991 B1 | 6/2003 | Maeda et al. |
| 6,686,588 B1 | 2/2004 | Webster et al. |
| 6,713,857 B1 | 3/2004 | Tsai |
| 6,768,208 B2 | 7/2004 | Lin et al. |
| 6,782,610 B1 | 8/2004 | Iijima et al. |
| 6,867,073 B1 | 3/2005 | Enquist |
| 6,887,769 B2 | 5/2005 | Kellar et al. |
| 6,908,027 B2 | 6/2005 | Tolchinsky et al. |
| 6,962,835 B2 | 11/2005 | Tong et al. |
| 7,045,453 B2 | 5/2006 | Canaperi et al. |
| 7,078,811 B2 | 7/2006 | Suga |
| 7,105,980 B2 | 9/2006 | Abbott et al. |
| 7,126,212 B2 | 10/2006 | Enquist et al. |
| 7,193,423 B1 | 3/2007 | Dalton et al. |
| 7,262,492 B2 | 8/2007 | Pieda et al. |
| 7,319,197 B2 | 1/2008 | Oggioni et al. |
| 7,354,798 B2 | 4/2008 | Pogge et al. |
| 7,385,283 B2 | 6/2008 | Wu et al. |
| 7,554,203 B2 | 6/2009 | Zhou et al. |
| 7,566,634 B2 | 7/2009 | Beyne et al. |
| 7,582,971 B2 | 9/2009 | Kameyama et al. |
| 7,589,409 B2 | 9/2009 | Gibson et al. |
| 7,663,231 B2 | 2/2010 | Chang et al. |
| 7,750,488 B2 | 7/2010 | Patti et al. |
| 7,759,751 B2 | 7/2010 | Ono |
| 7,781,309 B2 | 8/2010 | Morita et al. |
| 7,786,572 B2 | 8/2010 | Chen |
| 7,790,578 B2 | 9/2010 | Furui |
| 7,803,693 B2 | 9/2010 | Trezza |
| 7,816,235 B2 | 10/2010 | Chan et al. |
| 7,816,856 B2 | 10/2010 | Cok et al. |
| 7,843,052 B1 | 11/2010 | Yoo et al. |
| 7,897,481 B2 | 3/2011 | Chiou et al. |
| 7,932,616 B2 | 4/2011 | Meguro |
| 7,977,789 B2 | 7/2011 | Park |
| 8,026,181 B2 | 9/2011 | Arita et al. |
| 8,044,497 B2 | 10/2011 | Cheah et al. |
| 8,049,303 B2 | 11/2011 | Osaka et al. |
| 8,064,224 B2 | 11/2011 | Mahajan et al. |
| 8,168,458 B2 | 5/2012 | Do et al. |
| 8,178,963 B2 | 5/2012 | Yang |
| 8,178,964 B2 | 5/2012 | Yang |
| 8,183,127 B2 | 5/2012 | Patti et al. |
| 8,193,632 B2 | 6/2012 | Chang et al. |
| 8,227,904 B2 | 7/2012 | Braunisch et al. |
| 8,241,961 B2 | 8/2012 | Kim et al. |
| 8,263,434 B2 | 9/2012 | Pagaila et al. |
| 8,314,007 B2 | 11/2012 | Vaufredaz |
| 8,349,635 B1 | 1/2013 | Gan et al. |
| 8,377,798 B2 | 2/2013 | Peng et al. |
| 8,405,225 B2 | 3/2013 | Yu et al. |
| 8,441,131 B2 | 5/2013 | Ryan |
| 8,456,856 B2 | 6/2013 | Lin et al. |
| 8,476,146 B2 | 7/2013 | Chen et al. |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,513,088 B2 | 8/2013 | Yoshimura et al. |
| 8,519,514 B2 | 8/2013 | Fujii |
| 8,524,533 B2 | 9/2013 | Tong et al. |
| 8,620,164 B2 | 12/2013 | Heck et al. |
| 8,647,987 B2 | 2/2014 | Yang et al. |
| 8,691,601 B2 | 4/2014 | Izuha |
| 8,697,493 B2 | 4/2014 | Sadaka |
| 8,716,105 B2 | 5/2014 | Sadaka et al. |
| 8,791,575 B2 | 7/2014 | Oganesian et al. |
| 8,802,538 B1 | 8/2014 | Liu |
| 8,809,123 B2 | 8/2014 | Liu et al. |
| 8,841,002 B2 | 9/2014 | Tong |
| 8,878,353 B2 | 11/2014 | Haba et al. |
| 8,901,748 B2 | 12/2014 | Manusharow et al. |
| 8,912,670 B2 | 12/2014 | Teh et al. |
| 8,963,335 B2 | 2/2015 | Woychik et al. |
| 8,975,163 B1 | 3/2015 | Lei et al. |
| 8,975,726 B2 | 3/2015 | Chen et al. |
| 8,987,137 B2 | 3/2015 | Bachman et al. |
| 8,988,299 B2 | 3/2015 | Kam et al. |
| 9,006,908 B2 | 4/2015 | Pincu et al. |
| 9,029,242 B2 | 5/2015 | Holden et al. |
| 9,054,101 B2 | 6/2015 | Semmelmeyer et al. |
| 9,059,010 B2 | 6/2015 | Yoshida et al. |
| 9,076,860 B1 | 7/2015 | Lei et al. |
| 9,076,929 B2 | 7/2015 | Katsuno et al. |
| 9,093,350 B2 | 7/2015 | Endo et al. |
| 9,126,236 B2 | 9/2015 | Roos et al. |
| 9,136,293 B2 | 9/2015 | Yee et al. |
| 9,142,517 B2 | 9/2015 | Liu et al. |
| 9,153,552 B2 | 10/2015 | Teh et al. |
| 9,159,690 B2 | 10/2015 | Chiu |
| 9,171,756 B2 | 10/2015 | Enquist et al. |
| 9,171,816 B2 | 10/2015 | Teh et al. |
| 9,184,125 B2 | 11/2015 | Enquist et al. |
| 9,190,380 B2 | 11/2015 | Teh et al. |
| 9,224,697 B1 | 12/2015 | Kwon et al. |
| 9,224,704 B2 | 12/2015 | Landru |
| 9,230,941 B2 | 1/2016 | Chen et al. |
| 9,252,172 B2 | 2/2016 | Chow et al. |
| 9,257,399 B2 | 2/2016 | Kuang et al. |
| 9,269,701 B2 | 2/2016 | Starkston et al. |
| 9,275,971 B2 | 3/2016 | Chiu et al. |

(56) References Cited

U.S. PATENT DOCUMENTS

| | | |
|---|---|---|
| 9,299,736 B2 | 3/2016 | Chen et al. |
| 9,312,198 B2 | 4/2016 | Meyer et al. |
| 9,312,229 B2 | 4/2016 | Chen et al. |
| 9,331,149 B2 | 5/2016 | Tong et al. |
| 9,337,235 B2 | 5/2016 | Chen et al. |
| 9,343,433 B2 | 5/2016 | Lee et al. |
| 9,349,703 B2 | 5/2016 | Chiu et al. |
| 9,355,997 B2 | 5/2016 | Katkar et al. |
| 9,368,866 B2 | 6/2016 | Yu |
| 9,373,527 B2 | 6/2016 | Yu et al. |
| 9,385,024 B2 | 7/2016 | Tong et al. |
| 9,394,161 B2 | 7/2016 | Cheng et al. |
| 9,431,368 B2 | 8/2016 | Enquist et al. |
| 9,437,572 B2 | 9/2016 | Chen et al. |
| 9,443,796 B2 | 9/2016 | Chou et al. |
| 9,443,824 B1 | 9/2016 | We et al. |
| 9,461,007 B2 | 10/2016 | Chun et al. |
| 9,466,586 B1 | 10/2016 | Choi et al. |
| 9,476,898 B2 | 10/2016 | Takano |
| 9,496,239 B1 | 11/2016 | Edelstein et al. |
| 9,524,959 B1 | 12/2016 | Yeh et al. |
| 9,536,848 B2 | 1/2017 | England et al. |
| 9,559,081 B1 | 1/2017 | Lai et al. |
| 9,570,421 B2 | 2/2017 | Wu et al. |
| 9,601,353 B2 | 3/2017 | Huang et al. |
| 9,620,481 B2 | 4/2017 | Edelstein et al. |
| 9,627,365 B1 | 4/2017 | Yu et al. |
| 9,653,433 B2 | 5/2017 | Yu et al. |
| 9,656,852 B2 | 5/2017 | Cheng et al. |
| 9,666,502 B2 | 5/2017 | Chen et al. |
| 9,666,559 B2 | 5/2017 | Wang et al. |
| 9,673,096 B2 | 6/2017 | Hirschler et al. |
| 9,674,939 B2 | 6/2017 | Scannell |
| 9,704,827 B2 | 7/2017 | Huang et al. |
| 9,722,098 B1 | 8/2017 | Chung et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,768,133 B1 | 9/2017 | Wu et al. |
| 9,799,587 B2 | 10/2017 | Fujii et al. |
| 9,818,729 B1 | 11/2017 | Chiu et al. |
| 9,852,988 B2 | 12/2017 | Enquist et al. |
| 9,865,567 B1 | 1/2018 | Chaware et al. |
| 9,881,882 B2 | 1/2018 | Hsu et al. |
| 9,893,004 B2 | 2/2018 | Yazdani |
| 9,899,442 B2 | 2/2018 | Katkar |
| 9,929,050 B2 | 3/2018 | Lin |
| 9,941,180 B2 | 4/2018 | Kim et al. |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 9,966,360 B2 | 5/2018 | Yu et al. |
| 9,972,611 B2 | 5/2018 | Pappu et al. |
| 9,991,231 B2 | 6/2018 | Woychik et al. |
| 10,008,844 B2 | 6/2018 | Wang et al. |
| 10,026,605 B2 | 7/2018 | Doub et al. |
| 10,032,722 B2 | 7/2018 | Yu et al. |
| 10,074,630 B2 | 9/2018 | Kelly et al. |
| 10,075,657 B2 | 9/2018 | Fahim et al. |
| 10,170,409 B2 | 1/2019 | Ganesan et al. |
| 10,204,893 B2 | 2/2019 | Uzoh et al. |
| 10,269,619 B2 | 4/2019 | Yu et al. |
| 10,269,756 B2 | 4/2019 | Uzoh |
| 10,269,853 B2 | 4/2019 | Katkar et al. |
| 10,276,619 B2 | 4/2019 | Kao et al. |
| 10,276,909 B2 | 4/2019 | Huang et al. |
| 10,333,623 B1 | 6/2019 | Liao et al. |
| 10,410,976 B2 | 9/2019 | Asano et al. |
| 10,418,277 B2 | 9/2019 | Cheng et al. |
| 10,446,456 B2 | 10/2019 | Shen et al. |
| 10,446,487 B2 | 10/2019 | Huang et al. |
| 10,446,532 B2 | 10/2019 | Uzoh et al. |
| 10,504,824 B1 | 12/2019 | Pan et al. |
| 10,508,030 B2 | 12/2019 | Katkar et al. |
| 10,510,629 B2 | 12/2019 | Chen et al. |
| 10,522,499 B2 | 12/2019 | Enquist et al. |
| 10,529,690 B2 | 1/2020 | Shih et al. |
| 10,529,693 B2 | 1/2020 | Agarwal et al. |
| 10,559,507 B1 | 2/2020 | Saketi et al. |
| 10,580,823 B2 | 3/2020 | Zhang et al. |
| 10,629,567 B2 | 4/2020 | Uzoh et al. |
| 10,636,767 B2 | 4/2020 | Haba |
| 10,672,674 B2 | 6/2020 | Yu et al. |
| 10,707,087 B2 | 7/2020 | Uzoh et al. |
| 10,707,145 B2 | 7/2020 | Bultitude et al. |
| 10,727,204 B2 | 7/2020 | Agarwal et al. |
| 10,727,219 B2 | 7/2020 | Uzoh et al. |
| 10,770,430 B1 | 9/2020 | Kim et al. |
| 10,784,191 B2 | 9/2020 | Huang et al. |
| 10,790,262 B2 | 9/2020 | Uzoh et al. |
| 10,840,135 B2 | 11/2020 | Uzoh |
| 10,840,205 B2 | 11/2020 | Fountain, Jr. et al. |
| 10,854,578 B2 | 12/2020 | Morein |
| 10,872,852 B2 | 12/2020 | Shih |
| 10,879,212 B2 | 12/2020 | Uzoh et al. |
| 10,879,226 B2 | 12/2020 | Uzoh et al. |
| 10,886,177 B2 | 1/2021 | DeLaCruz et al. |
| 10,892,246 B2 | 1/2021 | Uzoh |
| 10,910,344 B2 | 2/2021 | DeLaCruz et al. |
| 10,923,408 B2 | 2/2021 | Huang et al. |
| 10,923,413 B2 | 2/2021 | DeLaCruz |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,037,919 B2 | 6/2021 | Uzoh et al. |
| 11,056,348 B2 | 7/2021 | Theil |
| 11,056,390 B2 | 7/2021 | Uzoh et al. |
| 11,069,734 B2 | 7/2021 | Katkar |
| 11,088,099 B2 | 8/2021 | Katkar et al. |
| 11,127,738 B2 | 9/2021 | DeLaCruz et al. |
| 11,145,623 B2 | 10/2021 | Hsu et al. |
| 11,158,573 B2 | 10/2021 | Uzoh et al. |
| 11,158,606 B2 | 10/2021 | Gao et al. |
| 11,169,326 B2 | 11/2021 | Huang et al. |
| 11,171,117 B2 | 11/2021 | Gao et al. |
| 11,176,450 B2 | 11/2021 | Teig et al. |
| 11,195,748 B2 | 12/2021 | Uzoh et al. |
| 11,205,625 B2 | 12/2021 | DeLaCruz et al. |
| 11,222,863 B2 | 1/2022 | Hua et al. |
| 11,244,920 B2 | 2/2022 | Uzoh |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,296,044 B2 | 4/2022 | Gao et al. |
| 11,296,053 B2 | 4/2022 | Uzoh et al. |
| 11,329,034 B2 | 5/2022 | Tao et al. |
| 11,348,898 B2 | 5/2022 | DeLaCruz et al. |
| 11,355,404 B2 | 6/2022 | Gao et al. |
| 11,355,427 B2 | 6/2022 | Loo et al. |
| 11,355,443 B2 | 6/2022 | Huang et al. |
| 11,367,652 B2 | 6/2022 | Uzoh et al. |
| 11,373,963 B2 | 6/2022 | DeLaCruz et al. |
| 11,380,597 B2 | 7/2022 | Katkar et al. |
| 11,385,278 B2 | 7/2022 | DeLaCruz et al. |
| 11,387,202 B2 | 7/2022 | Haba et al. |
| 11,387,214 B2 | 7/2022 | Wang et al. |
| 11,393,779 B2 | 7/2022 | Gao et al. |
| 11,437,423 B2 | 9/2022 | Takachi |
| 11,462,419 B2 | 10/2022 | Haba |
| 11,476,213 B2 | 10/2022 | Haba et al. |
| 11,538,781 B2 | 12/2022 | Haba |
| 11,558,029 B2 | 1/2023 | Ito |
| 11,631,647 B2 | 4/2023 | Haba |
| 11,652,083 B2 | 5/2023 | Uzoh et al. |
| 11,658,173 B2 | 5/2023 | Uzoh et al. |
| 11,728,273 B2 | 8/2023 | Haba |
| 11,764,177 B2 | 9/2023 | Haba |

(56) References Cited

U.S. PATENT DOCUMENTS

| | | |
|---|---|---|
| 11,764,189 B2 | 9/2023 | Gao et al. |
| 11,817,409 B2 | 11/2023 | Haba et al. |
| 11,837,582 B2 | 12/2023 | Gao et al. |
| 11,837,596 B2 | 12/2023 | Uzoh et al. |
| 11,916,054 B2 | 2/2024 | Enquist et al. |
| 11,916,076 B2 | 2/2024 | DeLaCruz et al. |
| 11,955,463 B2 | 4/2024 | Uzoh et al. |
| 12,046,482 B2 | 7/2024 | Haba |
| 12,046,569 B2 | 7/2024 | Haba |
| 12,113,056 B2 | 10/2024 | Uzoh et al. |
| 12,266,640 B2 | 4/2025 | Gao et al. |
| 12,266,650 B2 | 4/2025 | Uzoh et al. |
| 12,272,677 B2 | 4/2025 | Uzoh et al. |
| 2002/0000328 A1 | 1/2002 | Motomura et al. |
| 2002/0003307 A1 | 1/2002 | Suga |
| 2002/0004288 A1 | 1/2002 | Nishiyama |
| 2002/0074668 A1 | 6/2002 | Hofstee et al. |
| 2003/0148591 A1 | 8/2003 | Guo et al. |
| 2004/0084414 A1 | 5/2004 | Sakai et al. |
| 2004/0140546 A1 | 7/2004 | Lee et al. |
| 2004/0157407 A1 | 8/2004 | Tong et al. |
| 2004/0188501 A1 | 9/2004 | Tolchinsky et al. |
| 2004/0238927 A1 | 12/2004 | Miyazawa |
| 2005/0040530 A1 | 2/2005 | Shi |
| 2005/0101130 A1 | 5/2005 | Lopatin et al. |
| 2005/0104196 A1 | 5/2005 | Kashiwazaki |
| 2005/0133930 A1 | 6/2005 | Savastisuk et al. |
| 2005/0153522 A1 | 7/2005 | Hwang et al. |
| 2005/0161808 A1 | 7/2005 | Anderson |
| 2005/0218518 A1 | 10/2005 | Jiang et al. |
| 2006/0057945 A1 | 3/2006 | Hsu et al. |
| 2006/0063312 A1 | 3/2006 | Kurita |
| 2006/0087042 A1 | 4/2006 | Kameyama et al. |
| 2006/0220256 A1 | 10/2006 | Shim et al. |
| 2006/0223216 A1 | 10/2006 | Chang et al. |
| 2006/0234473 A1 | 10/2006 | Wong et al. |
| 2006/0278331 A1 | 12/2006 | Dugas et al. |
| 2007/0007639 A1 | 1/2007 | Fukazawa et al. |
| 2007/0080442 A1 | 4/2007 | Meyer-Berg |
| 2007/0096294 A1 | 5/2007 | Ikeda et al. |
| 2007/0111386 A1 | 5/2007 | Kim et al. |
| 2007/0122635 A1 | 5/2007 | Lu et al. |
| 2007/0123061 A1 | 5/2007 | Evertsen et al. |
| 2007/0148912 A1 | 6/2007 | Morita et al. |
| 2007/0158024 A1 | 7/2007 | Addison et al. |
| 2007/0158827 A1 | 7/2007 | Schuster |
| 2007/0222048 A1 | 9/2007 | Huang |
| 2007/0295456 A1 | 12/2007 | Gudeman et al. |
| 2008/0036082 A1 | 2/2008 | Eun |
| 2008/0079105 A1 | 4/2008 | Chang et al. |
| 2008/0165521 A1 | 7/2008 | Bernstein et al. |
| 2008/0227238 A1 | 9/2008 | Ko et al. |
| 2008/0231311 A1 | 9/2008 | Condorelli et al. |
| 2008/0265421 A1 | 10/2008 | Brunnbauer et al. |
| 2008/0268614 A1 | 10/2008 | Yang et al. |
| 2008/0272477 A1 | 11/2008 | Do et al. |
| 2008/0308928 A1 | 12/2008 | Chang |
| 2008/0315372 A1 | 12/2008 | Kuan et al. |
| 2009/0029274 A1 | 1/2009 | Olson et al. |
| 2009/0068831 A1 | 3/2009 | Enquist et al. |
| 2009/0095399 A1 | 4/2009 | Zussy et al. |
| 2009/0149023 A1 | 6/2009 | Koyanagi |
| 2009/0206461 A1 | 8/2009 | Yoon |
| 2009/0227089 A1 | 9/2009 | Plaut et al. |
| 2009/0252939 A1 | 10/2009 | Park et al. |
| 2009/0273094 A1 | 11/2009 | Ha et al. |
| 2009/0283898 A1 | 11/2009 | Janzen et al. |
| 2009/0321939 A1 | 12/2009 | Chandrasekaran |
| 2010/0081236 A1 | 4/2010 | Yang et al. |
| 2010/0112782 A1 | 5/2010 | Teixeira |
| 2010/0123268 A1 | 5/2010 | Menard |
| 2010/0129999 A1 | 5/2010 | Zingher et al. |
| 2010/0164083 A1 | 7/2010 | Yim |
| 2010/0167534 A1 | 7/2010 | Iwata |
| 2010/0213819 A1 | 8/2010 | Cok et al. |
| 2010/0258952 A1 | 10/2010 | Fjelstad |
| 2010/0259166 A1 | 10/2010 | Cok et al. |
| 2010/0315110 A1 | 12/2010 | Fenner et al. |
| 2010/0327424 A1 | 12/2010 | Braunisch et al. |
| 2011/0042814 A1 | 2/2011 | Okuyama |
| 2011/0049696 A1 | 3/2011 | Haba et al. |
| 2011/0074033 A1 | 3/2011 | Kaltalioglu et al. |
| 2011/0128399 A1 | 6/2011 | Fujii |
| 2011/0165707 A1* | 7/2011 | Lott .................... H01S 5/0217 |
| | | 257/E33.056 |
| 2011/0186977 A1 | 8/2011 | Chi et al. |
| 2011/0233702 A1* | 9/2011 | Takahashi ............ H10F 39/812 |
| | | 257/E31.127 |
| 2011/0248397 A1 | 10/2011 | Coffy et al. |
| 2011/0278717 A1 | 11/2011 | Pagaila et al. |
| 2011/0278732 A1 | 11/2011 | Yu et al. |
| 2011/0290552 A1 | 12/2011 | Palmateer et al. |
| 2012/0003792 A1 | 1/2012 | Cheah et al. |
| 2012/0025396 A1 | 2/2012 | Liao et al. |
| 2012/0049344 A1 | 3/2012 | Pagaila et al. |
| 2012/0056314 A1 | 3/2012 | Pagaila et al. |
| 2012/0074585 A1 | 3/2012 | Koo et al. |
| 2012/0077314 A1 | 3/2012 | Park et al. |
| 2012/0119360 A1 | 5/2012 | Kim et al. |
| 2012/0187516 A1 | 7/2012 | Sato |
| 2012/0190187 A1 | 7/2012 | Yang et al. |
| 2012/0194719 A1 | 8/2012 | Churchwell et al. |
| 2012/0199930 A1* | 8/2012 | Hayashi ............ H10F 39/8057 |
| | | 257/E31.127 |
| 2012/0199960 A1 | 8/2012 | Cosue et al. |
| 2012/0212384 A1 | 8/2012 | Kam et al. |
| 2012/0217644 A1 | 8/2012 | Pagaila |
| 2012/0228762 A1 | 9/2012 | Fukuda et al. |
| 2012/0238070 A1 | 9/2012 | Libbert et al. |
| 2013/0001798 A1 | 1/2013 | Choi |
| 2013/0009325 A1 | 1/2013 | Mori |
| 2013/0037936 A1 | 2/2013 | Choi et al. |
| 2013/0037962 A1 | 2/2013 | Xue |
| 2013/0069239 A1 | 3/2013 | Kim et al. |
| 2013/0075923 A1 | 3/2013 | Park et al. |
| 2013/0082399 A1 | 4/2013 | Kim et al. |
| 2013/0122655 A1 | 5/2013 | Yu et al. |
| 2013/0169355 A1 | 7/2013 | Chen et al. |
| 2013/0187292 A1 | 7/2013 | Semmelmeyer et al. |
| 2013/0214427 A1 | 8/2013 | Nakanoya |
| 2013/0234320 A1 | 9/2013 | Lu et al. |
| 2013/0264684 A1 | 10/2013 | Yu et al. |
| 2013/0265733 A1 | 10/2013 | Herbsommer et al. |
| 2013/0277855 A1 | 10/2013 | Kang et al. |
| 2013/0299997 A1 | 11/2013 | Sadaka |
| 2013/0334697 A1 | 12/2013 | Shin et al. |
| 2014/0008789 A1 | 1/2014 | Cho |
| 2014/0013606 A1 | 1/2014 | Nah et al. |
| 2014/0097536 A1 | 4/2014 | Schunk |
| 2014/0124818 A1 | 5/2014 | Hwang et al. |
| 2014/0154839 A1 | 6/2014 | Ahn et al. |
| 2014/0175655 A1 | 6/2014 | Chen et al. |
| 2014/0187040 A1 | 7/2014 | Enquist et al. |
| 2014/0217604 A1 | 8/2014 | Chou et al. |
| 2014/0225795 A1 | 8/2014 | Yu |
| 2014/0263959 A1* | 9/2014 | Hsu .................... H10F 39/014 |
| | | 250/206 |
| 2014/0264836 A1 | 9/2014 | Chun et al. |
| 2014/0299981 A1 | 10/2014 | Goh et al. |
| 2014/0312511 A1 | 10/2014 | Nakamura |
| 2014/0327150 A1 | 11/2014 | Jung et al. |
| 2014/0370658 A1 | 12/2014 | Tong et al. |
| 2014/0377909 A1 | 12/2014 | Chung et al. |
| 2015/0021754 A1 | 1/2015 | Lin et al. |
| 2015/0048500 A1 | 2/2015 | Yu et al. |
| 2015/0048503 A1 | 2/2015 | Chiu et al. |
| 2015/0064498 A1 | 3/2015 | Tong |
| 2015/0097022 A1 | 4/2015 | Di Cioccio et al. |
| 2015/0102468 A1 | 4/2015 | Kang et al. |
| 2015/0130030 A1 | 5/2015 | Ma et al. |
| 2015/0130082 A1 | 5/2015 | Lu et al. |
| 2015/0145094 A1* | 5/2015 | Liu .................. H01L 21/76898 |
| | | 257/459 |
| 2015/0145140 A1 | 5/2015 | Haba et al. |

(56) References Cited

U.S. PATENT DOCUMENTS

| | | |
|---|---|---|
| 2015/0162294 A1 | 6/2015 | Kawasaki |
| 2015/0171050 A1 | 6/2015 | Chen et al. |
| 2015/0171063 A1 | 6/2015 | Zhai et al. |
| 2015/0179481 A1 | 6/2015 | Lin |
| 2015/0179605 A1 | 6/2015 | Dubey et al. |
| 2015/0194406 A1 | 7/2015 | Teh et al. |
| 2015/0200153 A1 | 7/2015 | Wang et al. |
| 2015/0200182 A1 | 7/2015 | Wang et al. |
| 2015/0206865 A1 | 7/2015 | Yu et al. |
| 2015/0235949 A1 | 8/2015 | Yu et al. |
| 2015/0235991 A1 | 8/2015 | Gu et al. |
| 2015/0270209 A1 | 9/2015 | Woychik et al. |
| 2015/0287672 A1 | 10/2015 | Yazdani |
| 2015/0287697 A1 | 10/2015 | Tsai et al. |
| 2015/0303174 A1 | 10/2015 | Yu et al. |
| 2015/0325557 A1* | 11/2015 | Yiu .................. H01L 25/16 438/48 |
| 2015/0340285 A1 | 11/2015 | Enquest et al. |
| 2015/0371951 A1 | 12/2015 | Yeh et al. |
| 2016/0020235 A1* | 1/2016 | Yamashita .......... H10F 39/811 250/206 |
| 2016/0035687 A1 | 2/2016 | Lin et al. |
| 2016/0071770 A1 | 3/2016 | Albermann et al. |
| 2016/0093592 A1 | 3/2016 | Zhai |
| 2016/0126634 A1 | 5/2016 | Liu et al. |
| 2016/0141267 A1 | 5/2016 | Hagimoto et al. |
| 2016/0141280 A1* | 5/2016 | Lin .................. H10F 39/804 257/292 |
| 2016/0155724 A1 | 6/2016 | Kim et al. |
| 2016/0163650 A1 | 6/2016 | Gao et al. |
| 2016/0190103 A1 | 6/2016 | Kabe et al. |
| 2016/0218082 A1 | 7/2016 | Lee et al. |
| 2016/0233175 A1 | 8/2016 | Dubey et al. |
| 2016/0233196 A1 | 8/2016 | Kim et al. |
| 2016/0254249 A1 | 9/2016 | Jeng et al. |
| 2016/0254299 A1* | 9/2016 | Gomi .................. H01L 25/065 257/447 |
| 2016/0260684 A1 | 9/2016 | Zhai et al. |
| 2016/0276296 A1 | 9/2016 | Woychik et al. |
| 2016/0300813 A1 | 10/2016 | Zhai et al. |
| 2016/0300817 A1 | 10/2016 | Do et al. |
| 2016/0315071 A1 | 10/2016 | Zhai et al. |
| 2016/0322330 A1 | 11/2016 | Lin et al. |
| 2016/0329284 A1 | 11/2016 | We et al. |
| 2016/0343682 A1 | 11/2016 | Kawasaki |
| 2016/0343685 A1 | 11/2016 | Lin et al. |
| 2016/0343695 A1 | 11/2016 | Lin et al. |
| 2016/0351499 A1 | 12/2016 | Kitada |
| 2016/0358891 A1 | 12/2016 | Geissler et al. |
| 2016/0372323 A1 | 12/2016 | Doub et al. |
| 2017/0023405 A1 | 1/2017 | Fahim et al. |
| 2017/0062366 A1 | 3/2017 | Enquist |
| 2017/0062383 A1 | 3/2017 | Yee et al. |
| 2017/0084576 A1 | 3/2017 | Yu et al. |
| 2017/0092680 A1* | 3/2017 | Kwon .................. H01L 23/481 |
| 2017/0179078 A1 | 4/2017 | Yu et al. |
| 2017/0125379 A1 | 5/2017 | Chen et al. |
| 2017/0141040 A1 | 5/2017 | Yu et al. |
| 2017/0148764 A1 | 5/2017 | Wang et al. |
| 2017/0148777 A1 | 5/2017 | Bono et al. |
| 2017/0179029 A1 | 6/2017 | Enquist et al. |
| 2017/0186799 A1* | 6/2017 | Lin .................. H01L 24/80 |
| 2017/0194271 A1 | 7/2017 | Hsu et al. |
| 2017/0200659 A1 | 7/2017 | Gaynes et al. |
| 2017/0200711 A1 | 7/2017 | Uzoh et al. |
| 2017/0200756 A1 | 7/2017 | Kao et al. |
| 2017/0207158 A1* | 7/2017 | Kang .................. H01L 24/17 |
| 2017/0243845 A1 | 8/2017 | Lee et al. |
| 2017/0250160 A1 | 8/2017 | Wu et al. |
| 2017/0250161 A1 | 8/2017 | Haba |
| 2017/0263518 A1 | 9/2017 | Yu et al. |
| 2017/0263595 A1 | 9/2017 | Kurita et al. |
| 2017/0284951 A1 | 10/2017 | Pindl et al. |
| 2017/0287874 A1 | 10/2017 | Fang et al. |
| 2017/0294422 A1 | 10/2017 | Solimando et al. |
| 2017/0330855 A1 | 11/2017 | Tung et al. |
| 2017/0338214 A1 | 11/2017 | Uzoh et al. |
| 2017/0345761 A1 | 11/2017 | Yu et al. |
| 2017/0358533 A1 | 12/2017 | Briggs et al. |
| 2017/0358553 A1 | 12/2017 | Kim et al. |
| 2017/0365580 A1 | 12/2017 | Shih et al. |
| 2017/0365582 A1 | 12/2017 | Seo et al. |
| 2017/0365591 A1 | 12/2017 | Chang et al. |
| 2018/0005984 A1 | 1/2018 | Yu et al. |
| 2018/0005992 A1 | 1/2018 | Yu et al. |
| 2018/0006006 A1 | 1/2018 | Kim et al. |
| 2018/0012787 A1 | 1/2018 | Oka et al. |
| 2018/0012863 A1 | 1/2018 | Yu et al. |
| 2018/0026008 A1 | 1/2018 | Jeng et al. |
| 2018/0053746 A1 | 2/2018 | Yu et al. |
| 2018/0061741 A1 | 3/2018 | Beyne |
| 2018/0068958 A1 | 3/2018 | Cho et al. |
| 2018/0068978 A1 | 3/2018 | Jeng et al. |
| 2018/0096931 A1 | 4/2018 | Huang et al. |
| 2018/0096988 A1 | 4/2018 | Long et al. |
| 2018/0122774 A1 | 5/2018 | Huang et al. |
| 2018/0130691 A1 | 5/2018 | Uzoh |
| 2018/0130769 A1 | 5/2018 | Tan et al. |
| 2018/0151477 A1 | 5/2018 | Yu et al. |
| 2018/0158749 A1 | 6/2018 | Yu et al. |
| 2018/0174995 A1 | 6/2018 | Wang et al. |
| 2018/0175008 A1* | 6/2018 | Fong .................. H01L 25/105 |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0191047 A1 | 7/2018 | Huang et al. |
| 2018/0219038 A1 | 8/2018 | Gambino et al. |
| 2018/0226375 A1 | 8/2018 | Enquist et al. |
| 2018/0269143 A1 | 9/2018 | Adams et al. |
| 2018/0273377 A1 | 9/2018 | Katkar et al. |
| 2018/0286805 A1 | 10/2018 | Huang et al. |
| 2018/0294212 A1 | 10/2018 | Chen et al. |
| 2018/0301443 A1* | 10/2018 | Kim .................. H01L 21/568 |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2018/0337157 A1 | 11/2018 | Wang et al. |
| 2018/0342435 A1 | 11/2018 | Yu et al. |
| 2018/0366436 A1 | 12/2018 | Wang et al. |
| 2018/0366437 A1 | 12/2018 | Chen et al. |
| 2018/0366442 A1 | 12/2018 | Gu et al. |
| 2018/0366446 A1 | 12/2018 | Haba et al. |
| 2019/0029119 A1 | 1/2019 | Weber |
| 2019/0043792 A1 | 2/2019 | Weerasekera et al. |
| 2019/0043910 A1* | 2/2019 | Miyazawa .............. H01L 25/18 |
| 2019/0043914 A1* | 2/2019 | Von Känel ............ H10F 39/811 |
| 2019/0067247 A1 | 2/2019 | Yoo et al. |
| 2019/0088621 A1 | 3/2019 | Yang et al. |
| 2019/0096741 A1 | 3/2019 | Uzoh et al. |
| 2019/0096825 A1 | 3/2019 | Kim et al. |
| 2019/0096842 A1 | 3/2019 | Fountain, Jr. et al. |
| 2019/0103409 A1 | 4/2019 | Xu et al. |
| 2019/0103425 A1* | 4/2019 | Yoon .................. H10F 71/139 |
| 2019/0109119 A1 | 4/2019 | Shih et al. |
| 2019/0115277 A1 | 4/2019 | Yu et al. |
| 2019/0123006 A1 | 4/2019 | Chen et al. |
| 2019/0131277 A1 | 5/2019 | Yang et al. |
| 2019/0157333 A1 | 5/2019 | Tsai |
| 2019/0189590 A1 | 6/2019 | Agarwal et al. |
| 2019/0189607 A1 | 6/2019 | Uzoh et al. |
| 2019/0198407 A1 | 6/2019 | Huang et al. |
| 2019/0198409 A1 | 6/2019 | Katkar et al. |
| 2019/0206791 A1 | 7/2019 | Pietambaram et al. |
| 2019/0214423 A1* | 7/2019 | Kim .................. H01L 24/16 |
| 2019/0221548 A1 | 7/2019 | Huang et al. |
| 2019/0237374 A1 | 8/2019 | Huang et al. |
| 2019/0265411 A1 | 8/2019 | Huang et al. |
| 2019/0267334 A1 | 8/2019 | Bowers |
| 2019/0319007 A1 | 10/2019 | Uzoh et al. |
| 2019/0333550 A1 | 10/2019 | Fisch |
| 2019/0333871 A1 | 10/2019 | Chen et al. |
| 2019/0341306 A1 | 11/2019 | Yu et al. |

(56) References Cited

U.S. PATENT DOCUMENTS

| | | |
|---|---|---|
| 2019/0341332 A1 | 11/2019 | Lin et al. |
| 2019/0341350 A1 | 11/2019 | Huang et al. |
| 2019/0348336 A1 | 11/2019 | Katkar et al. |
| 2019/0355637 A1 | 11/2019 | Chen et al. |
| 2019/0355706 A1 | 11/2019 | Enquist et al. |
| 2019/0371763 A1 | 12/2019 | Agarwal et al. |
| 2019/0372000 A1 | 12/2019 | Yu et al. |
| 2019/0385935 A1 | 12/2019 | Gao et al. |
| 2019/0385966 A1 | 12/2019 | Gao et al. |
| 2019/0385981 A1 | 12/2019 | Chen et al. |
| 2020/0006173 A1 | 1/2020 | Chen et al. |
| 2020/0006309 A1 | 1/2020 | Chen et al. |
| 2020/0013637 A1 | 1/2020 | Haba |
| 2020/0013667 A1 | 1/2020 | Leobandung |
| 2020/0013765 A1 | 1/2020 | Fountain, Jr. et al. |
| 2020/0035560 A1 | 1/2020 | Block et al. |
| 2020/0035641 A1 | 1/2020 | Fountain, Jr. et al. |
| 2020/0043853 A1 | 2/2020 | Kim et al. |
| 2020/0058617 A1 | 2/2020 | Wu et al. |
| 2020/0075520 A1 | 3/2020 | Gao et al. |
| 2020/0075534 A1 | 3/2020 | Gao et al. |
| 2020/0075553 A1 | 3/2020 | DeLaCruz et al. |
| 2020/0091217 A1* | 3/2020 | Horikoshi ......... H01L 21/76898 |
| 2020/0098736 A1 | 3/2020 | Liao et al. |
| 2020/0106156 A1 | 4/2020 | Lu et al. |
| 2020/0118973 A1 | 4/2020 | Wang et al. |
| 2020/0126906 A1 | 4/2020 | Uzoh et al. |
| 2020/0135684 A1 | 4/2020 | Kim et al. |
| 2020/0176419 A1 | 6/2020 | Dabral et al. |
| 2020/0185367 A1 | 6/2020 | Bhagavat et al. |
| 2020/0194396 A1 | 6/2020 | Uzoh |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0294920 A1 | 9/2020 | Hariri et al. |
| 2020/0303311 A1 | 9/2020 | Young et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0371154 A1 | 11/2020 | DeLaCruz et al. |
| 2020/0395300 A1 | 12/2020 | Xie et al. |
| 2020/0395321 A1 | 12/2020 | Katkar et al. |
| 2020/0403006 A1 | 12/2020 | DeLaCruz et al. |
| 2020/0411483 A1 | 12/2020 | Uzoh et al. |
| 2021/0020577 A1 | 1/2021 | Hu |
| 2021/0028080 A1 | 1/2021 | Pietambaram et al. |
| 2021/0057309 A1 | 2/2021 | Hu et al. |
| 2021/0057343 A1 | 2/2021 | Chang et al. |
| 2021/0057352 A1 | 2/2021 | Agarwal et al. |
| 2021/0066219 A1 | 3/2021 | Chen et al. |
| 2021/0082797 A1 | 3/2021 | Lee et al. |
| 2021/0082822 A1 | 3/2021 | Aleksov et al. |
| 2021/0082825 A1 | 3/2021 | Strong et al. |
| 2021/0098411 A1 | 4/2021 | Liff et al. |
| 2021/0098412 A1 | 4/2021 | Haba et al. |
| 2021/0098421 A1 | 4/2021 | Wu et al. |
| 2021/0104487 A1 | 4/2021 | Uzoh et al. |
| 2021/0111125 A1 | 4/2021 | Chen et al. |
| 2021/0118832 A1 | 4/2021 | Chen et al. |
| 2021/0118864 A1 | 4/2021 | DeLaCruz et al. |
| 2021/0125933 A1 | 4/2021 | Chen et al. |
| 2021/0125965 A1 | 4/2021 | Lu |
| 2021/0134724 A1 | 5/2021 | Rubin et al. |
| 2021/0143125 A1 | 5/2021 | DeLaCruz et al. |
| 2021/0181510 A1 | 6/2021 | Katkar et al. |
| 2021/0183847 A1 | 6/2021 | Uzoh et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0202396 A1 | 7/2021 | Wu et al. |
| 2021/0225708 A1 | 7/2021 | Lee et al. |
| 2021/0225780 A1 | 7/2021 | Wu et al. |
| 2021/0242152 A1 | 8/2021 | Fountain, Jr. et al. |
| 2021/0280507 A1 | 9/2021 | Aldrete et al. |
| 2021/0280517 A1 | 9/2021 | May et al. |
| 2021/0280522 A1 | 9/2021 | Liu |
| 2021/0296282 A1 | 9/2021 | Gao et al. |
| 2021/0305122 A1 | 9/2021 | Lai et al. |
| 2021/0305202 A1 | 9/2021 | Uzoh et al. |
| 2021/0335726 A1 | 10/2021 | Wu et al. |
| 2021/0366820 A1 | 11/2021 | Uzoh |
| 2021/0366970 A1 | 11/2021 | Katkar |
| 2021/0375708 A1 | 12/2021 | Kuo et al. |
| 2021/0375737 A1 | 12/2021 | Lin |
| 2021/0375827 A1 | 12/2021 | Chen et al. |
| 2021/0384133 A1 | 12/2021 | Ong et al. |
| 2021/0384135 A1 | 12/2021 | Kuan et al. |
| 2021/0384158 A1 | 12/2021 | Chung et al. |
| 2021/0391271 A1 | 12/2021 | Hsu et al. |
| 2021/0391272 A1 | 12/2021 | Tsai et al. |
| 2021/0391283 A1 | 12/2021 | Hsu et al. |
| 2021/0391284 A1 | 12/2021 | Hsu et al. |
| 2021/0407941 A1 | 12/2021 | Haba |
| 2022/0005787 A1 | 1/2022 | Han et al. |
| 2022/0020729 A1 | 1/2022 | Gao et al. |
| 2022/0077063 A1 | 3/2022 | Haba |
| 2022/0077087 A1 | 3/2022 | Haba |
| 2022/0122934 A1 | 4/2022 | Haba |
| 2022/0139867 A1 | 5/2022 | Uzoh |
| 2022/0139869 A1 | 5/2022 | Gao et al. |
| 2022/0189941 A1 | 6/2022 | Enquist et al. |
| 2022/0199560 A1 | 6/2022 | Haba et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0278084 A1 | 9/2022 | Ong et al. |
| 2022/0285303 A1 | 9/2022 | Mirkarimi et al. |
| 2022/0293567 A1 | 9/2022 | Uzoh et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2022/0375864 A1 | 11/2022 | Wang et al. |
| 2022/0399294 A1 | 12/2022 | Dogiamis et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0130580 A1 | 4/2023 | Uzoh et al. |
| 2023/0131849 A1 | 4/2023 | Uzoh et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215739 A1 | 7/2023 | Haba et al. |
| 2023/0215836 A1 | 7/2023 | Haba et al. |
| 2023/0245950 A1 | 8/2023 | Haba et al. |
| 2023/0253367 A1 | 8/2023 | Gao et al. |
| 2023/0268300 A1 | 8/2023 | Uzoh et al. |
| 2023/0282610 A1 | 9/2023 | Uzoh et al. |
| 2023/0282634 A1 | 9/2023 | Enquist et al. |
| 2023/0299029 A1 | 9/2023 | Theil et al. |

(56) References Cited

U.S. PATENT DOCUMENTS

| | | |
|---|---|---|
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2023/0420398 A1 | 12/2023 | Haba |
| 2023/0420399 A1 | 12/2023 | Haba et al. |
| 2024/0006377 A1 | 1/2024 | Wang et al. |
| 2024/0038702 A1 | 2/2024 | Uzoh |
| 2024/0055407 A1 | 2/2024 | Workman et al. |
| 2024/0079376 A1 | 3/2024 | Suwito et al. |
| 2024/0105674 A1 | 3/2024 | Uzoh et al. |
| 2024/0145458 A1 | 5/2024 | Uzoh et al. |
| 2024/0170411 A1 | 5/2024 | Chang et al. |
| 2024/0186248 A1 | 6/2024 | Haba et al. |
| 2024/0186268 A1 | 6/2024 | Uzoh et al. |
| 2024/0186269 A1 | 6/2024 | Haba |
| 2024/0203948 A1 | 6/2024 | Uzoh et al. |
| 2024/0213191 A1 | 6/2024 | Theil et al. |
| 2024/0213210 A1 | 6/2024 | Haba et al. |
| 2024/0217210 A1 | 7/2024 | Zhao et al. |
| 2024/0222239 A1 | 7/2024 | Gao et al. |
| 2024/0222315 A1 | 7/2024 | Uzoh |
| 2024/0222319 A1 | 7/2024 | Gao et al. |
| 2024/0243103 A1 | 7/2024 | Gao et al. |
| 2024/0266255 A1 | 8/2024 | Haba et al. |
| 2024/0298454 A1 | 9/2024 | Haba |
| 2024/0304593 A1 | 9/2024 | Uzoh |
| 2024/0312951 A1 | 9/2024 | Theil et al. |
| 2024/0332184 A1 | 10/2024 | Katkar et al. |
| 2024/0332227 A1 | 10/2024 | Uzoh et al. |
| 2024/0332231 A1 | 10/2024 | Uzoh |
| 2024/0332248 A1 | 10/2024 | Uzoh |
| 2024/0332267 A1 | 10/2024 | Haba et al. |
| 2024/0387419 A1 | 11/2024 | Mrozek et al. |
| 2025/0004197 A1 | 1/2025 | Haba et al. |
| 2025/0006632 A1 | 1/2025 | Chang et al. |
| 2025/0006642 A1 | 1/2025 | Haba et al. |
| 2025/0006674 A1 | 1/2025 | Uzoh et al. |
| 2025/0006679 A1 | 1/2025 | Theil et al. |
| 2025/0006689 A1 | 1/2025 | Uzoh et al. |
| 2025/0046625 A1 | 2/2025 | Haba |
| 2025/0054854 A1 | 2/2025 | Katkar et al. |
| 2025/0079364 A1 | 3/2025 | Uzoh et al. |
| 2025/0112123 A1 | 4/2025 | Katkar et al. |

FOREIGN PATENT DOCUMENTS

| | | | |
|---|---|---|---|
| CN | 105810649 A | 7/2016 | |
| CN | 107527885 | 12/2017 | |
| CN | 112687701 A * | 4/2021 | ............ H10B 41/27 |
| EP | 1011133 A1 | 6/2000 | |
| EP | 2 339 614 A1 | 6/2011 | |
| EP | 2 685 491 A2 | 1/2014 | |
| JP | 04-337694 | 11/1992 | |
| JP | 2000-100679 | 4/2000 | |
| JP | 2001-102479 | 4/2001 | |
| JP | 2001-284520 | 10/2001 | |
| JP | 2002-353416 | 12/2002 | |
| JP | 2002-359345 | 12/2002 | |
| JP | 2004-193493 | 7/2004 | |
| JP | 2007-294724 A | 11/2007 | |
| JP | 2008-130603 A | 6/2008 | |
| JP | 2009-135348 | 6/2009 | |
| JP | 2010-034294 A | 2/2010 | |
| JP | 2010-073964 | 4/2010 | |
| JP | 2011001412 A | 1/2011 | |
| JP | 2011-171614 | 9/2011 | |
| JP | 2012191062 A | 10/2012 | |
| JP | 2013-33786 | 2/2013 | |
| JP | 2013168577 A | 8/2013 | |
| JP | 2017-130610 | 7/2017 | |
| JP | 2018-160519 | 10/2018 | |
| KR | 10-2001-0104643 | 11/2001 | |
| KR | 10-2004-0020827 | 3/2004 | |
| KR | 10-2010-0123755 | 11/2010 | |
| KR | 10-2015-0097798 | 8/2015 | |
| KR | 10-2018-0054419 | 5/2018 | |
| KR | 101901711 B1 | 9/2018 | |
| KR | 10-2020-0060670 | 6/2020 | |
| KR | 10-2020-0092236 | 8/2020 | |
| TW | I464810 B | 12/2014 | |
| WO | WO 2005/043584 A2 | 5/2005 | |
| WO | WO 2006/100444 A1 | 9/2006 | |
| WO | WO 2008/112101 A2 | 9/2008 | |
| WO | WO 2009/005898 A1 | 1/2009 | |
| WO | WO 2010/024678 A1 | 3/2010 | |
| WO | WO 2012/004964 A1 | 1/2012 | |
| WO | WO 2014/052445 A1 | 4/2014 | |
| WO | WO 2015/134227 A1 | 9/2015 | |
| WO | WO 2017/034654 A1 | 3/2017 | |
| WO | WO 2017/052652 A1 | 3/2017 | |
| WO | WO 2017/151442 A1 | 9/2017 | |
| WO | WO 2019/054364 | 3/2019 | |

OTHER PUBLICATIONS

Bush, Steve, "Electronica: Automotive power modules from On Semi," ElectronicsWeekly.com, indicating an Onsemi AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

Chang, T.C. et al., "A method for fabricating a superior oxide/nitride/oxide gate stack," Electrochemical and Solid-State Letters, 2004, vol. 7, No. 7, pp. G138-G140.

Chung et al., "Room temperature GaAs—Si and InP—Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.

Chung et al., "Wafer direct bonding of compound semiconductors and silicon at room temperature by the surface activated bonding method," Applied Surface Science, Jun. 2, 1997, vols. 117-118, pp. 808-812.

"Die-to-Wafer Fusion and Hybrid Bonding," EV Group, https://www.evgroup.com/technologies/die-to-wafer-fusion-and-hybrid-bonding/, printed Sep. 21, 2022, 8 pages.

Farrens et al., "Chemical free room temperature wafer to wafer direct bonding," J. Electrochem. Soc., The Electrochemical Society, Inc., Nov. 1995, vol. 142, No. 11. pp. 3949-3955.

Farrens et al., "Chemical free wafer bonding of silicon to glass and sapphire," Electrochemical Society Proceedings vol. 95-7, 1995, pp. 72-77.

Frumusanu, Andrei, "TSMC's version of EMIB is 'LSI': Currently in pre-qualification," AnandTech, https://www.anandtech.com/show/16031/tsmcs-version-of-emib-lsi-3dfabric, Aug. 25, 2020, 6 pages.

Fukushima, T. et al., "New three-dimensional integration technology using self-assembly technique," International Electron Devices Meeting Dec. 5-7, 2005, IEEE, Dec. 5, 2005, pp. 348-351.

Gao, G. et al., "Low temperature hybrid bonding for die to wafer stacking applications," 2021 IEEE 71st Electronic Components and Technology Conference (ECTC), IEEE, Jun. 1, 2021-Jul. 4, 2021.

Gösele et al., "Semiconductor Wafer Bonding: A flexible approach to materials combinations in microelectronics; micromechanics and optoelectronics," IEEE, 1997, pp. 23-32.

Hooper, A. et al. "Review of wafer dicing techniques for via-middle process 3DI/TSV ultrathin silicon device wafers," 2015 IEEE 65th Electronic Components and Technology Conference (ECTC).

Hosoda et al., "Effect of the surface treatment on the room-temperature bonding of Al to Si and SiO2," Journal of Materials Science, Jan. 1, 1998, vol. 33, Issue 1, pp. 253-258.

Hosoda et al., "Room temperature GaAs—Si and InP—Si wafer direct bonding by the surface activated bonding method," Nuclear Inst. And Methods in Physics Research B, 1997, vol. 121, Nos. 1-4, pp. 203-206.

(56) References Cited

OTHER PUBLICATIONS

Howlader et al., "A novel method for bonding of ionic wafers," Electronics Components and Technology Conference, 2006, IEEE, pp. 7-pp.
Howlader et al., "Bonding of p-Si/n-InP wafers through surface activated bonding method at room temperature," Indium Phosphide and Related Materials, 2001, IEEE International Conference On, pp. 272-275.
Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.
Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.
International Search Report and Written Opinion mailed Sep. 22, 2017, issued in International Application No. PCT/US2017/029187, 20 pages.
International Search Report and Written Opinion mailed Apr. 22, 2019 in International Application No. PCT/US2018/064982, 13 pages.
International Search Report and Written Opinion mailed Oct. 18, 2019, PCT Appl. No. PCT/US2019/042894, 9 pages.
International Search Report and Written Opinion mailed May 7, 2020, issued in International Application No. PCT/US2020/013377, 16 pages.
Itoh et al., "Characteristics of fritting contacts utilized for micromachined wafer probe cards," 2000 American Institute of Physics, AIP Review of Scientific Instruments, vol. 71, 2000, pp. 2224.
Itoh et al., "Characteristics of low force contact process for MEMS probe cards," Sensors and Actuators A: Physical, Apr. 1, 2002, vols. 97-98, pp. 462-467.
Itoh et al., "Development of Mems IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.
Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.
Jin, H. et al., "Silicon / Silicon Oxide / LPCVD Silicon Nitride Stacks: The Effect of Oxide Thickness on Bulk Damage and Surface Passivation," Centre for Sustainable Energy Systems, Faculty of Engineering and Information Technology, The Australian National University, Canberra ACT 0200, Australia, 3 pages.
Ker, Ming-Dou et al., "Fully process-compatible layout design on bond pad to improve wire bond reliability in CMOS ICs," IEEE Transactions on Components and Packaging Technologies, Jun. 2002, vol. 25, No. 2, pp. 309-316.
Kim et al., "Low temperature direct Cu—Cu bonding with low energy ion activation method," Electronic Materials and Packaging, 2001, IEEE, pp. 193-195.
Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.
Kim et al., "Wafer-scale activated bonding of Cu—Cu, Cu—Si, and Cu—SiO2 at low temperature," Proceedings—Electrochemical Society, 2003, vol. 19, pp. 239-247.
"Lecture 29: Productivity and process yield," National Programme on Technology Enhanced Learning (NPTEL), MM5017: Electronic materials, devices, and fabrication, 16 pages.
Marinov, Val et al., "Laser-enabled advanced packaging of ultrathin bare dice in flexible substrates," IEEE Transactions on Components, Packaging and Manufacturing Technology, Apr. 2012, vol. 2, No. 4, pp. 569-577.
Matsuzawa et al., "Room-temperature interconnection of electroplated Au microbump by means of surface activated bonding method," Electronic Components and Technology Conference, 2001, 51st Proceedings, IEEE, pp. 384-387.
Moriceau, H. et al., "Overview of recent direct wafer bonding advances and applications," Advances in Natural Sciences—Nanoscience and Nanotechnology, 2010, 11 pages.
Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(l), 6 pages.
Office Action for U.S. Appl. No. 15/159,649, mailed Sep. 14, 2017, 9 pages.
Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.
Onsemi AR0820 image, cross section of a CMOS image sensor product. The part in the image was shipped on Sep. 16, 2021. Applicant makes no representation that the part in the image is identical to the part identified in the separately submitted reference Bush, Nov. 8, 2018, Electronics Weekly.com ("Bush article"); however, the imaged part and the part shown in the BUSH article share the part number "Onsemi AR0820."
Plobi, A. et al., "Wafer direct bonding: tailoring adhesion between brittle materials," Materials Science and Engineering Review Journal, 1999, R25, 88 pages.
Reiche et al., "The effect of a plasma pretreatment on the Si/Si bonding behaviour," Electrochemical Society Proceedings, 1998, vol. 97-36, pp. 437-444.
Roberds et al., "Low temperature , in situ, plasma activated wafer bonding," Electrochemical Society Proceedings, 1997, vol. 97-36, pp. 598-606.
Shigetou et al., "Room temperature bonding of ultra-fine pitch and low-profiled Cu electrodes for bump-less interconnect," 2003 Electronic Components and Technology Conference, pp. 848-852.
Shigetou et al., "Room-temperature direct bonding of CMP-Cu film for bumpless interconnection," Electronic Components and Technology Conference, 51st Proceedings, 2001, IEEE, pp. 755-760.
Shingo et al., "Design and fabrication of an electrostatically actuated MEMS probe card," Tranducers, Solid-State Sensors, Actuators and Microsystems, 12th International Conference, Jun. 8-12, 2003, vol. 2, pp. 1522-1525.
Sony IMX260 image, cross section of Sony dual-pixel sensor product labeled IMX260, showing peripheral probe and wire bond pads in a bonded structure. The part in the image was shipped in Apr. 2016. Applicant makes no representation that the part in the image is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260."
Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Electronic Components and Technology Conference, 2001, IEEE, pp. 1013-1018.
Suga et al., "Bump-less interconnect for next generation system packaging," Electronic Components and Technology Conference, 2001, IEEE, pp. 1003-1008.
Suga, T., "Feasibility of surface activated bonding for ultra-fine pitch interconnection—A new concept of bump-less direct bonding for system level packaging," The University of Tokyo, Research

(56) References Cited

OTHER PUBLICATIONS

Center for Science and Technology, 2000 Electronic Components and Technology Conference, 2000 IEEE, pp. 702-705.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.
Suga et al., "Surface activated bonding—an approach to joining at room temperature," Ceramic Transactions: Structural Ceramics Joining II, The American Ceramic Society, 1993, pp. 323-331.
Suga et al., "Surface activated bonding for new flip chip and bumpless interconnect systems," Electronic Components and Technology Conference, 2002, IEEE, pp. 105-111.
Suga, "UHV room temperature joining by the surface activated bonding method," Advances in science and technology, Techna, Faenza, Italie, 1999, pp. C1079-C1089.
Supplemental European Search Report dated Jun. 19, 2019 in European Application No. 17799846.5, 16 pages.
Takagi et al., "Effect of surface roughness on room-temperature wafer bonding by Ar beam surface activation," Japanese Journal of Applied Physics, 1998, vol. 37, Part 1, No. 1, pp. 4197.
Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.
Takagi et al., "Room-temperature bonding of lithium niobate and silicon wafers by argon-beam surface activation," Appl. Phys. Lett., 1999. vol. 74, pp. 2387.
Takagi et al., "Room temperature silicon wafer direct bonding in vacuum by Ar beam irradiation," Micro Electro Mechanical Systems, MEMS '97 Proceedings, 1997, IEEE, pp. 191-196.
Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.
Takagi et al., "Room-temperature wafer bonding of silicon and lithium niobate by means of arbon-beam surface activation," Integrated Ferroelectrics: An International Journal, 2002, vol. 50, Issue 1, pp. 53-59.
Takagi et al., "Surface activated bonding silicon wafers at room temperature," Appl. Phys. Lett. 68, 2222 (1996).
Takagi et al., "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.
Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.

"The effects of edge trimming—Engineering R&D Division, Operation V," Disco Technical Review Mar. 2016, 3 pages.
Tong et al., "Low temperature wafer direct bonding, Journal of Microelectomechanical systems," Mar. 1994, vol. 3, No. 1, pp. 29-35.
Topol et al., "Enabling technologies for wafer-level bonding of 3D MEMS and integrated circuit structures," 2004 Electronics Components and Technology Conference, 2004 IEEE, pp. 931-938.
Uhrmann, T. et al., "Heterogeneous integration by collective die-to-wafer bonding," Chip Scale Review, Nov./Dec. 2018, vol. 22, No. 6, pp. 10-12.
Wang et al., "Reliability and microstructure of Au—Al and Au—Cu direct bonding fabricated by the Surface Activated Bonding," Electronic Components and Technology Conference, 2002, IEEE, pp. 915-919.
Wang et al., "Reliability of Au bump—Cu direct interconnections fabricated by means of surface activated bonding method," Microelectronics Reliability, May 2003, vol. 43, Issue 5, pp. 751-756.
Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.
Xu et al., "New Au—Al interconnect technology and its reliability by surface activated bonding," Electronic Packaging Technology Proceedings, Oct. 28-30, 2003, Shanghai, China, pp. 479-483.
Ceramic Microstructures: Control at the Atomic Level, Recent Progress in Surface Activated Bonding, 1998, pp. 385-389.
Michailos, Jean, "Future landscape for 3D Integration: from Interposers to 3D High Density," 3d ASIP—Dec. 13-15, 2016, San Francisco Airport, USA, 46 pages.
"Photo Etching DBC for Power Circuits—Direct Bond Copper (DBC) on Ceramic Used for Power Circuits," Conard Corporation, 2021, downloaded Nov. 9, 2021, https://www.conardcorp.com/photo-etching-dbc-for-power-circuits/, 2 pages.
Braunisch, H. et al., "High-speed performance of silicon bridge die-to-die interconnects," 2011 IEEE, pp. 95-98.
Khan et al., "Technologies for printing sensors and electronics over large flexible substrates," IEEE Sensors Journal, Jun. 2015, vol. 15, No. 6, pp. 3164-3185.
Lei, W.S. et al., "Die singulation technologies for advanced packaging: A critical review," J. Vac. Sci. Technol. B 30(4), Apr. 6, 2012, July/August 1012, pp. 040801-1-040801-27.
NASA SBIR/STTR Technologies, Proposal No. 09-1 S5.05-9060—Reliable Direct Bond Copper Ceramic Packages for High Temperature Power Electronics, Contract No. NNX10CE23P, PI: Ender Savrun, PhD, Sienna Technologies, Inc.—Woodinville, WA, 1 page.
Urteaga, M. et al., "THz bandwidth InP HBT technologies and heterogeneous integration with Si CMOS," 2016 IEEE Bipolar/BiCMOS Circuits and Technology Meeting (BCTM), 2016, pp. 35-41, doi: 10.1109/BCTM.2016.7738973.

\* cited by examiner

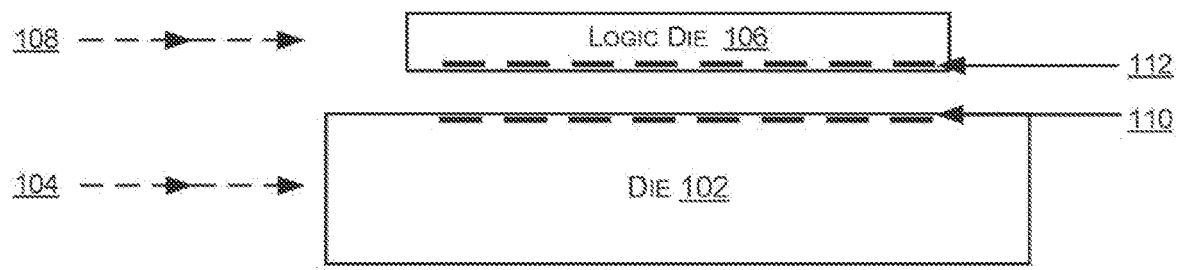
*FIG. 1A*
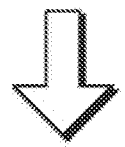
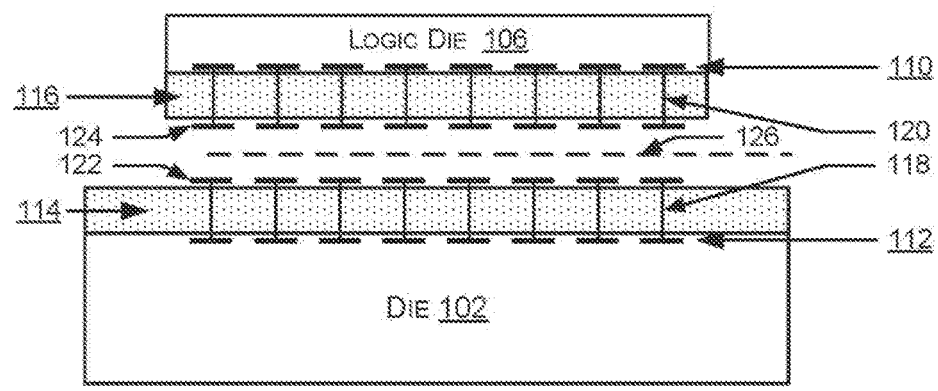
*FIG. 1B*
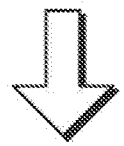

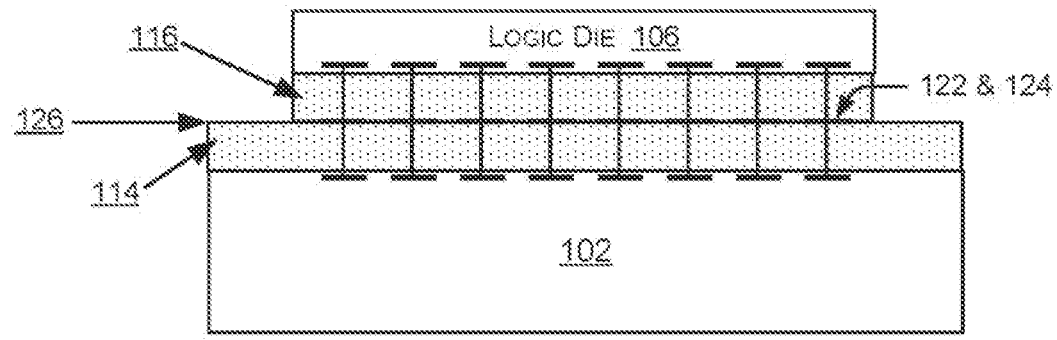
FIG. 2A
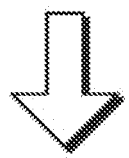
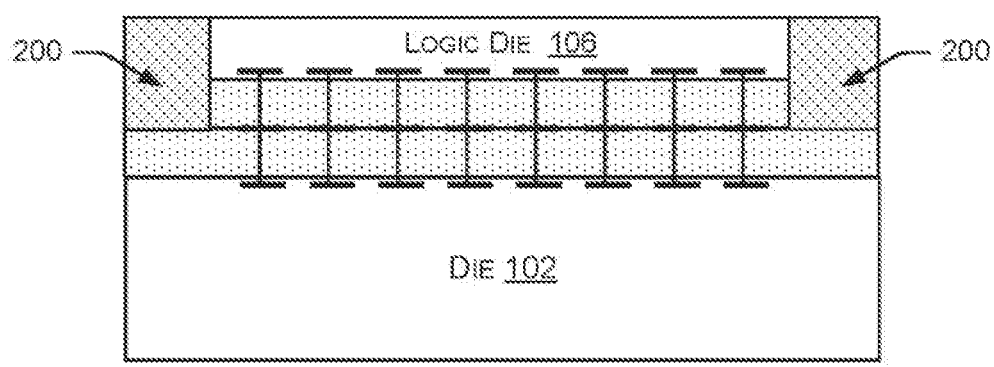
FIG. 2B
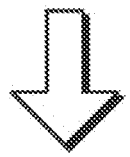
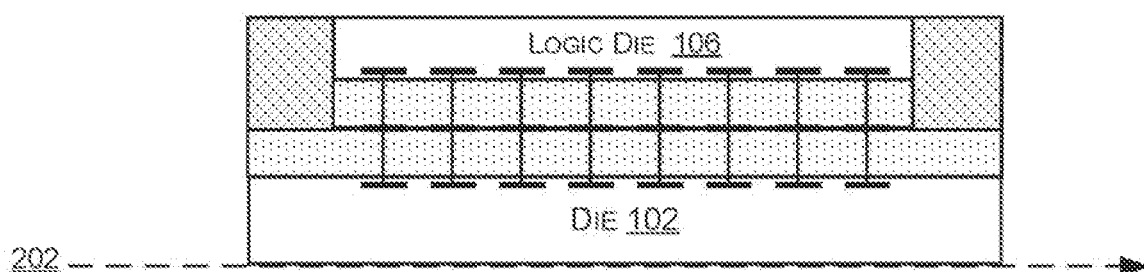
FIG. 2C

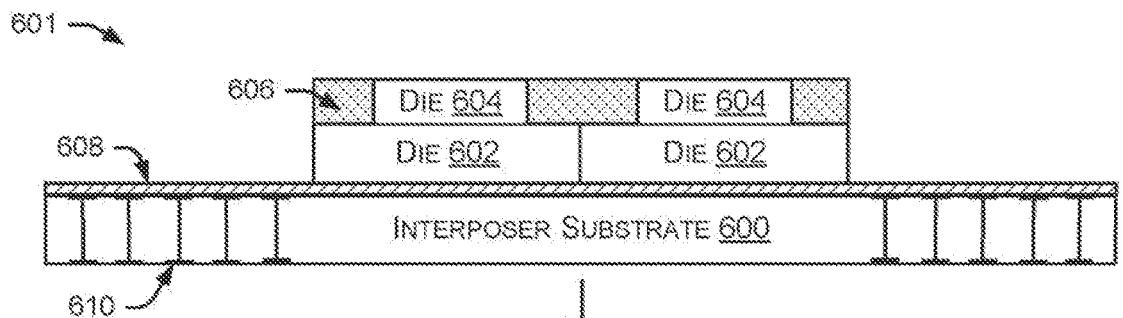
FIG. 6A To Bond With Wafer or Substrate
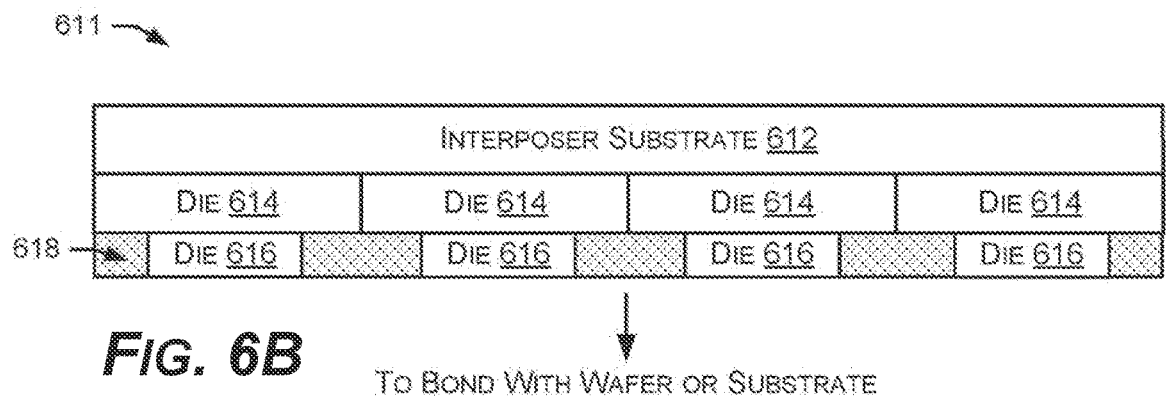
FIG. 6B To Bond With Wafer or Substrate
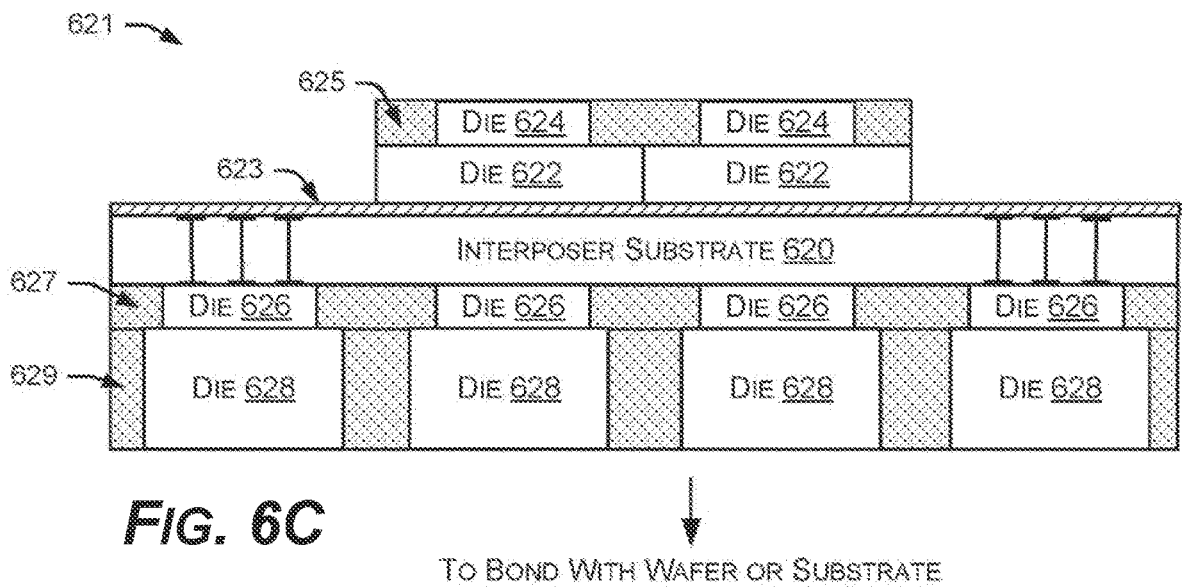
FIG. 6C To Bond With Wafer or Substrate

STACKED DEVICES AND METHODS OF FABRICATION

RELATED APPLICATIONS

This patent application is a continuation of U.S. patent application Ser. No. 17/586,236, filed Jan. 27, 2022, which is a continuation of U.S. patent application Ser. No. 16/413,429, filed May 15, 2019 (now U.S. Pat. No. 11,276,676), and claims the benefit of priority to U.S. Provisional Patent Application No. 62/671,917 to Enquist et. al., filed May 15, 2018, the disclosures of which are hereby incorporated by reference herein in their entireties.

BACKGROUND OF THE INVENTION

Field of the Invention

Conventional microelectronic packaging technologies dice wafers into individual integrated circuit microchips ("dies") and then package the dies, or arrange the dies onto horizontal substrates and into vertical stacks that make up microelectronics packages, such as 3-dimensional ICs ("3DICs). Separately, the fabrication processes that form the IC dies on semiconductor wafers in the first place use fabrication technologies in foundry environments that differ from the packaging environments and associated packaging techniques used in micropackaging houses. Micropackage design is a somewhat different science than wafer fabrication design, each using respective processes and materials. Conventional wafer level packaging (WLP) creates some packaging of the dies while still on the wafer, before dicing into individual micropackages, while conventional fan-out wafer level packaging (FOWLP) places a layer of known-good-dies on a carrier wafer or panel and creates a fan-out area around the dies with molding material. A redistribution layer then fans the leads of the dies out onto the larger footprint of the molding material around the dies in the single layer, and may array connective solder balls on the larger footprint.

Both fabrication of dies and micropackaging of the fabricated dies into 3DICs and interposers seek to be more efficient and cost effective, while providing more electronic circuits and more computing power in smaller and smaller packages. Constructing a microelectronics package can adopt novel structures not constrained by the usual planarity of semiconductor fabrication on horizontal surfaces of wafers. Thus, micropackaging often uses a wider variety of materials in the construction of 3DICs and interposers, such as plastic encapsulants, polymers, and structural substrate materials that are not limited to silicon and other semiconductors. Despite their common theme of making and using IC dies, the practices of conventional semiconductor fabrication and conventional microelectronics packaging are traditionally distinct and separate, albeit related, technologies.

BRIEF DESCRIPTION OF THE DRAWINGS

Certain embodiments of the disclosure will hereafter be described with reference to the accompanying drawings, wherein like reference numerals denote like elements. It should be understood, however, that the accompanying figures illustrate the various implementations described herein and are not meant to limit the scope of various technologies described herein.

FIGS. 1A and 1B are diagrams showing the start of a process for direct-bonding dies of a first footprint size to dies of a second footprint size in a wafer level process.

FIGS. 2A-2C are diagrams showing a continuation of the process of FIG. 1, for direct-bonding dies of a first footprint size to dies of a second footprint size in a wafer level process.

FIGS. 6A-6C are diagrams of example interposers with variegated dies in multiple layers on one or both sides of the interposers by direct-bonding dies of a first footprint size to dies of a second footprint size in a wafer level process.

DETAILED DESCRIPTION OF THE PREFERRED EMBODIMENT

Overview

Figure 3A:
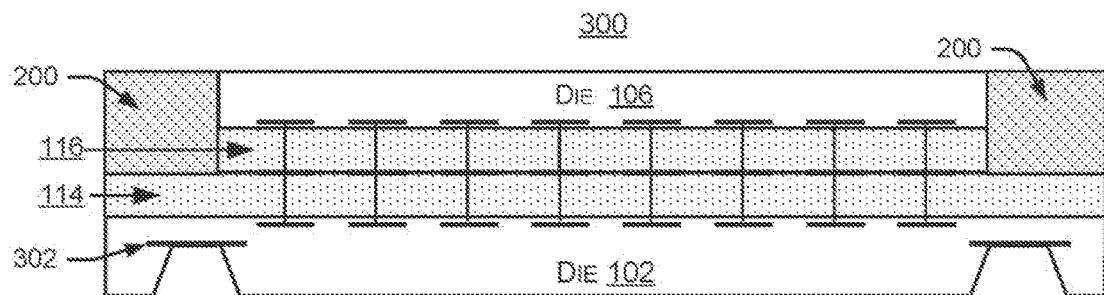
FIGS. 3A-3D are diagrams of example devices showing routing and interconnect variations in devices made by direct-bonding dies of a first footprint size to dies of a second footprint size in a wafer level process.

This disclosure describes stacked devices and associated methods of fabrication. Systems and methods described herein enable die-to-wafer (D2 W) or chip-to-wafer (C2 W) techniques to bond layers of dies of various physical sizes, form factors, and foundry nodes (process nodes, technology nodes) to a semiconductor wafer, to interposers, or to boards and panels (all of these may be referred to herein as "substrates"). The example systems and methods enable 3D stacking of variegated dies by direct hybrid bonding within a wafer level packaging (WLP) flow, including fan-out versions of 3D die stacks consisting of dies with different footprints—at the level of wafer level packaging. The systems and methods enable direct-bonding of layers of variegated dies mixed and matched from various different foundry nodes (process nodes, technology nodes), different form factors, different wafer sizes, and different package physical sizes into vertical stacks within a single micropackage at wafer level, with the benefits of high interconnect density and space-saving provided by the direct hybrid bonding. If the micropackage is an interposer, the interposer can have the variegated dies on one or both sides, including dies of different geometries stacked vertically on one or both sides. Interposers bearing multiple types of dies of various physical sizes and foundry nodes, including stacks of such dies, can then be bonded to a semiconductor wafer, in one example scenario.

Conventional wafer-to-wafer bonding usually implies that chip dimensions are identical for the vertical wafer layers being bonded, but the yield decreases dramatically with the number of layers because individually defective dies on the wafers being stacked make an entire individual vertical stack defective. The example systems and methods described herein allow mixing and matching of variegated dies from different wafer sizes and different foundry technologies to be picked and placed on a substrate (such as a wafer), and further allows these variegated dies of different physical dimensions to form stacked layers, all through direct-bonding techniques that provide high-density signal connections and smaller packages.

These example systems and methods enable creation of micropackage architecture in which conventionally incompatible dies picked from wafers that differ from each other in technology, foundry node, wafer size, and form factor can be bonded together in the same micropackage at wafer level without much restriction, given a common interconnect interface between any two units being direct-bonded together. The example systems and methods also provide the advantage of high yield production, since variegated dies selected from different sources for direct-bonding and stacking to a wafer or interposer can be known-good-dies (KGDs).

A foundry node ("technology node," "process node," "process technology," or simply "node") refers to a specific semiconductor manufacturing process and its design rules, and generally refers to a minimum feature size. Different nodes imply different architectures and circuits from different generations of the technology. Essentially, technology node refers to the physical size of the transistor being fabricated. The more recent the technology node, the smaller the transistors, with more transistors per unit area, which in turn provides faster switching, less energy use, and cooler operation than a previous version of the same technology node. Thus, smaller technology nodes generally have smaller feature sizes: smaller transistors that are faster and more power-efficient than those made according to an earlier node.

Silicon wafer diameter nodes, a different designation than foundry nodes, have progressed in the other direction, from smaller to larger. Recent silicon wafer diameter nodes are 150 mm, 200 mm, and 300 mm, with 450 mm on the horizon. Larger semiconductor wafers reduce the manufacturing cost per transistor by raising the integration level through device scaling and other factors such as improvement in production yield because of non-defect rate, and increased throughput in production volume per unit of time. As the area of wafer surface increases, the number of semiconductor dies obtainable from a wafer also increases, reducing the production cost per die. Larger, more recent wafer sizes tend to incorporate the latest technology nodes (smaller feature sizes). Between different possible semiconductor wafer size nodes, and different foundry nodes ("technology nodes" or "process nodes"), the physical sizes and electronic feature sizes of the resulting dies can vary greatly. These different dies from different size semiconductor wafers and made according to different foundry nodes are referred to herein as "variegated dies," that is, dies of different physical dimensions and different feature and technology sizes.

In an implementation, an example process described herein direct-bonds the variegated dies of various physical sizes, form factors, and/or foundry nodes to wafers of same or different size origin or foundry node, filling in lateral spaces caused by differences in physical sizes and form factors with a molding material to fill and complete a given horizontal bonding layer. This can be accomplished at wafer level. The molding material may be a molding compound, a resist material, a glass, a silicon spacer material, or a thermally conductive compound. The interstitial molding material may be extremely thin vertically, matching the layer's vertical thickness determined by the heights of the dies being direct-bonded in that layer. The particular bonding layer of dies and molding may then be planarized with chemical-mechanical planarization (CMP) or other polishing technique at wafer level to prepare for a next bonding layer of variegated dies from various foundry nodes and wafer sizes to be direct-bonded to the previous layer. The example process allows continued stacking of the variegated dies and interstitial molding within each bonding layer, to make vertical stacks of the variegated dies in a microelectronics package.

Conductive through-vias, interconnects, and/or leads can be disposed in the molding material disposed laterally between the variegated dies of a given direct-bonding layer of dies. This allows horizontal fan-out of the leads of dies of a given layer, and also allows vertical transmission of signals between adjacent layers of dies, or through multiple layers of dies, without necessarily having to create any vias through the dies themselves.

The coefficient of thermal expansion (CTE) of the molding material used in the example systems and methods aims to match the CTE of silicon or other semiconductor substrate material in use. This match of the CTEs between semiconductor and molding makes the molding material amenable to expansion and contraction of the semiconductor material caused by thermal fluctuations during further steps of the fabrication process, and also amenable to thermal fluctuations during operation of the micropackage when in use as a "chip" in an end device. Likewise, the hardness, density, friability, and other physical characteristics of the molding material is ideally formulated to match those of silicon or other semiconductor, so that CMP and other polishing and finishing processes cannot distinguish between the molding material and the semiconductor, for purposes of polishing to a flat or ultra-flat surface that is free from significant dishing and rounding: and so immediately available for further direct-bonding steps in construction of vertical stacks of the variegated dies.

In an implementation, since "direct-bonding" is the only bonding process used between dies, between dies and wafer, and between dies and interposer, then intervening connection structures such as ball grid arrays may be eliminated to save space. In an implementation, direct-bonding between dies, or between dies and wafer, can be between native interconnects of the logic circuits and other native circuits of the dies and wafers. This use of native interconnects direct-bonded together can save even more space, since in some cases standard interfaces may be eliminated during design of the variegated dies themselves.

Suitable direct-bonding techniques prepare surfaces for molecule-to-molecule, covalent, ionic, and/or metallic bonding between like materials on each side of the direct-bonding interface. For example, freshly prepared flat surfaces of copper metal (Cu) may bond to each other upon contact with or without pressure and heat, forming copper diffusion bonds, metal-to-metal bonds, and the like. Zibond® brand direct-bonding is one example direct-bonding technique for dielectrics, oxide materials, and other nonmetals (Xperi Corporation, San Jose, CA). Zibond® direct-bonding is a room temperature wafer-to-wafer or die-to-wafer direct-bonding technique. DBI® brand hybrid bonding, is an example direct-bonding technique for joining nonmetal (e.g., dielectric) surfaces that also have metal interconnects to be joined together in the same planar bonding interface (Xperi Corporation, San Jose, CA). The DBI direct hybrid bonding may be accomplished in one operation, in which oxide dielectric surfaces direct-bond together first, at room temperature, and then metal interconnects on each side of the bonding plane direct-bond together during an annealing phase at slightly or moderately elevated temperatures.

The molding material introduced above, when used as a filler or plastic encapsulant, is conventionally found in micropackaging technologies, and is also used for making reconstituted wafers having a layer of chips or dies diced from a first wafer, and then joined to a second carrier wafer or panel in a single layer on the wafer or panel. In micropackaging, such molding materials and various fillers may be put to use in layers of a few mils (a mil is one-thousandth of an inch or 0.001 inch), and up to far greater thicknesses in construction of a 3DIC.

The molding material suitable for the example systems and processes described herein is applied to fill-in lateral spaces between dies but in much thinner vertical layers than used for reconstituting wafers, at a vertical height suitable for the dies in the layer being direct-bonded to a previous layer. This molding material may be only a few microns thick (25.4 microns=1 mil), depending on the dimensions and form factor of the dies being direct-bonded to wafers and to other dies. The molding material is recruited to the wafer fabrication environment to make ultra-flat surfaces for direct hybrid bonding between layers of variegated dies. Whereas a conventional process for making a reconstituted wafer is limited to using the molding material as an encapsulant, the example processes herein are able to use the molding material to make surfaces suitable for direct-bonding stacks of variegated dies within the scope of the wafer level semiconductor fabrication process itself.

Example systems and methods are not limited to front-to-front direct hybrid bonding of dies to wafers, and front-to-front direct hybrid bonding of dies to other dies. Although front-to-front examples of stacked structures may be shown and described representatively herein, the direct bonding of dies to wafers or dies to dies according to the example system and methods described herein may be front-to-front, front-to-back, or back-to-back, when these possible configurations are desired in a given scenario. The use of handle wafers with intermediate temporary bond and debond steps may be used to present a back surface for bonding.

Example Stacked Structures

In FIGS. 1A and 1B and in all the figures described herein, the layers illustrated are not shown to relative scale. For example, layers of dielectric material and silicon that provide bonding layers and direct-bonding surfaces are shown with exaggerated thickness for the sake of illustration and description, and to emphasize their presence and their various features. Some of these layers of materials may be extremely thin layers, coatings, or deposits in actual microelectronic devices.

In FIGS. 1A and 1B and all the figures described herein, the various dies may be shown as direct-bonded to each other face-to-face, with direct hybrid bonding of both dielectric surfaces and metal interconnects between the dies at the bonding interfaces but the stacked structures shown and the related processes are not limited to face-to-face direct bonding of the dies. The dies on adjacent vertical layers of the example stacked structures may also be direct-bonded face-to-back and back-to-back in addition to the face-to-face direct bonding of the dies in the layers of the stacked structures.

FIG. 1A shows the start of an example process for making a microelectronic device using a wafer level process, including D2W techniques. A substrate, such as a wafer, has first dies 102 in a first layer 104, and at least some of the first dies 102 have a first footprint size and specific physical dimensions. Second dies 106 in a second layer 108 include dies with a second footprint size and/or different physical dimensions than the footprint size and physical dimensions of the first dies 102 in the first layer 104.

Dies 102 in the first layer 104 have a front side layer of metal contacts 110 providing electrical contacts and/or redistribution traces for integrated circuits of the dies 102. The metal contacts 110 can be built up into a bonding layer with interconnects for direct-bonding to the second dies 106, or in some cases the metal contacts 110 can be bonded directly to the second dies 106 without further buildup of redistribution layers (RDLs) or further vertical extension using through-vias.

Likewise, the second dies 106 residing in the second layer 108 have a respective layer of metal 112 for making electrical contacts that can be built up through RDLs or by vertical extension by through-vias, or in some cases direct-bonded directly to the first dies 102.

Turning to FIG. 1B, in one implementation, dielectric (or silicon) layers 114 and 116 are added to respective dies 102 and 106 to make direct hybrid bonding surfaces. In the through-vias (e.g., 118 and 120) or other interconnects or redistribution conductors rise vertically through the dielectric layers 114 and 116 to metal bonding pads 122 and 124 on the surfaces of the respective dies 102 and 106 for eventual direct-bonding at a bonding interface 126.

In FIG. 2A, continuing the example process, the surfaces of dielectric layers 114 and 116 and the respective metal bonding pads 122 and 124 all participate in direct hybrid bonding at the bonding interface 126. The two respective surfaces of dielectric layers 114 and 116 direct-bond to each other in dielectric-to-dielectric direct bonding, while the metal bonding pads 122 and 124 direct-bond to each other in metal-to-metal direct bonding, during an annealing phase of the same direct hybrid bonding operation, for example.

The first dies 102 of the wafer, or on a substrate, may be memory dies, sensor image dies, or other kinds of dies of various types and sizes. The second dies 106, with different physical dimensions and/or different footprints than the first dies 102, may be logic dies or other dies to be communicatively coupled with the first dies 102. Thus, the first dies 102 and the second dies 106 may be mixed and matched from different wafer sizes, different foundry nodes (process nodes, technology nodes), different footprints, different functionalities, different physical sizes, and so forth, referred to hereinafter as variegated dies.

Turning to FIG. 2B, in a next step, a molding material 200 is applied to at least partially fill-in spaces that occur horizontally between the second dies 106 in the second layer 108. The molding material 200 ideally has a similar CTE as the dies 106 or dielectric 116 (or silicon) that the molding material 200 is intervening between. The molding material may be a compound such as a filler material, a resist compound, silicon, a high thermal conductivity compound, formed diamond, deposited diamond, formed aluminum nitride, deposited aluminum nitride, a material with a CTE close to a CTE of silicon, a packaging material, or a board material, for example.

At this point in the example process and turning to FIG. 2C, wafer or substrate on which the first dies 102 reside may be thinned 202, especially if the second layer of dies 106 is the only layer to be direct-bonded to the layer of first dies 102.

FIGS. 3A-3D show various ways in which first dies 102 of a wafer, carrier, or substrate that have been direct-bonded to seconds dies 106 of different size, footprint, wafer-origin, and/or foundry node can be interconnected externally, outside their own micropackage.

In example micropackage 300, as depicted in FIG. 3A, a metallization layer 302 of the first dies 102 has pad areas available that can be etched out of each die 102 (or wafer or substrate) to make electrical contacts, either for external connection or for continuance of the fabrication of the micropackage 300.

Figure 3B:
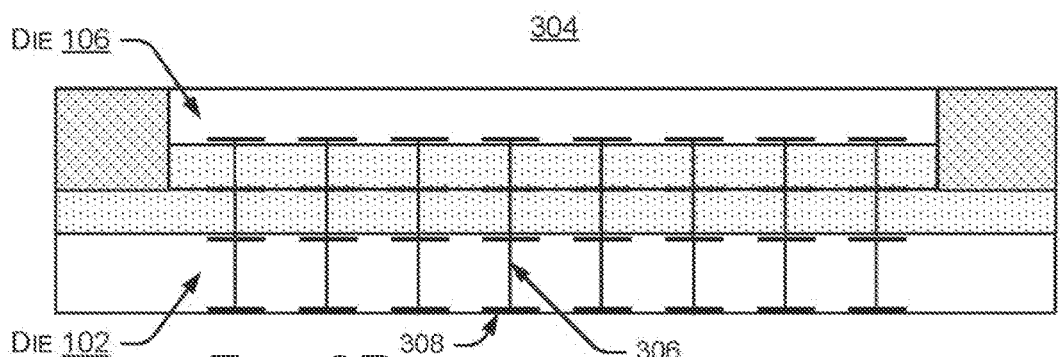

In example micropackage 304, as depicted in FIG. 3B, through silicon vias (TSVs) 306 are made through the first dies 102 to enable backside electrical connection at backside contact pads 308, for example, and/or construction of RDLs on the backside of the dies 102 or thinned wafer hosting the dies 102.

Figure 3C:
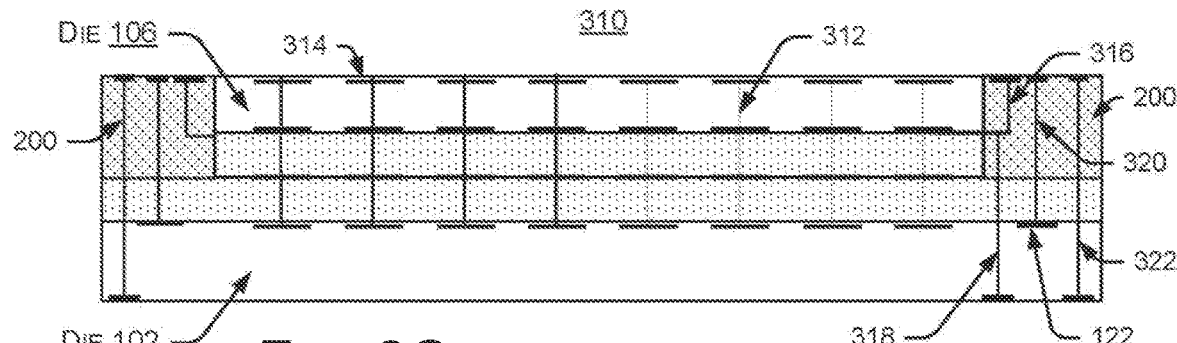

In example micropackage 310, as depicted in FIG. 3C, TSVs 312 are made through the second dies 106 to enable electrical connection at backside contact pads 314 of the second dies 106, for example, and/or to connect with RDLs to be fabricated on the backsides of the second dies 106.

Through-vias 316 may also be constructed to pass through the molding material 200 that has been applied to at least partially fill the spaces between dies 106 of a given direct-bonded layer. Such through vias 316 and 318 through the molding material 200 can extend to either side of the entire micropackage 310. Through-vias 320 can also extend from the contact pads 122 of the first dies 102, through the molding material 200, to the backside of the second dies 106 or beyond (if there are additional direct-bonded layers of dies). Similarly, through-vias 322 can extend all the way through the entire example micropackage 310, including through the molding material 200, from one side of the example micropackage 310 to the other.

Figure 3D:
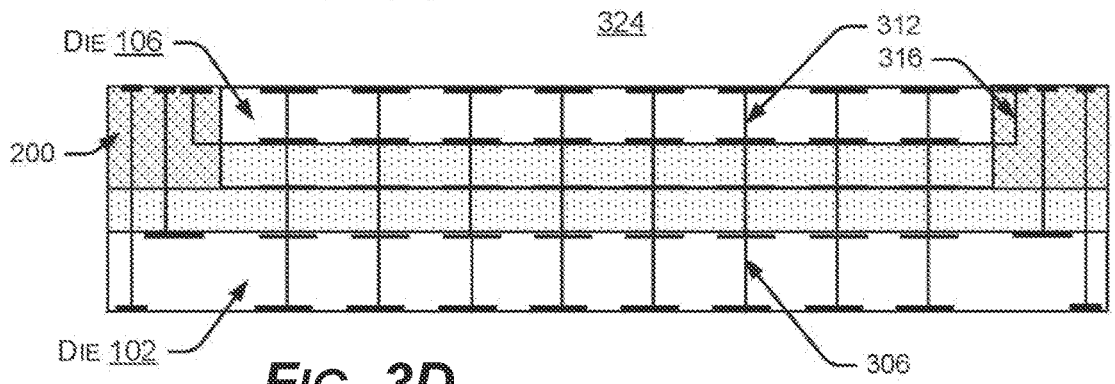

In example micropackage 324, as depicted in FIG. 3D, various TSVs 306 and 312 and various through-vias 316 extending through the molding material 200 can extend from the contact pads of dies 102 and 106 from multiple layers of the micropackage 324, to both front and back sides of the microelectronics package 324, traversing through the molding material 200 as needed.

Figure 4A:
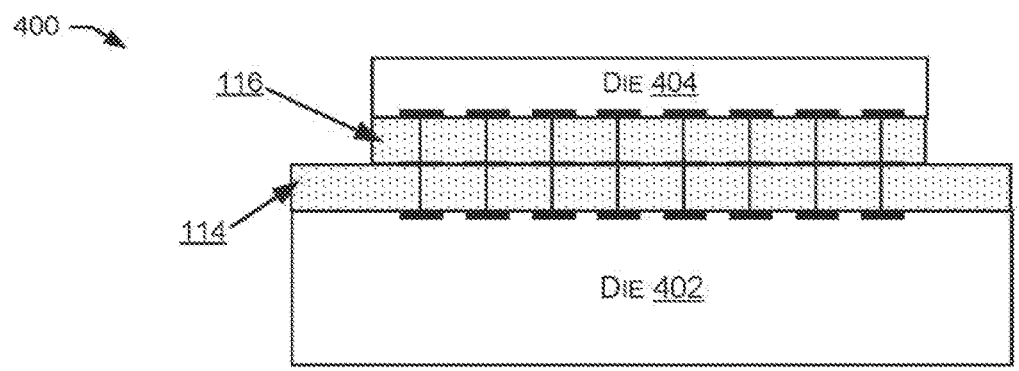
FIGS. 4A-4C are diagrams of an example micropackage and molding encapsulation fabricated by direct-bonding dies of a first footprint size to dies of a second footprint size in a wafer level process.
Figure 4B:
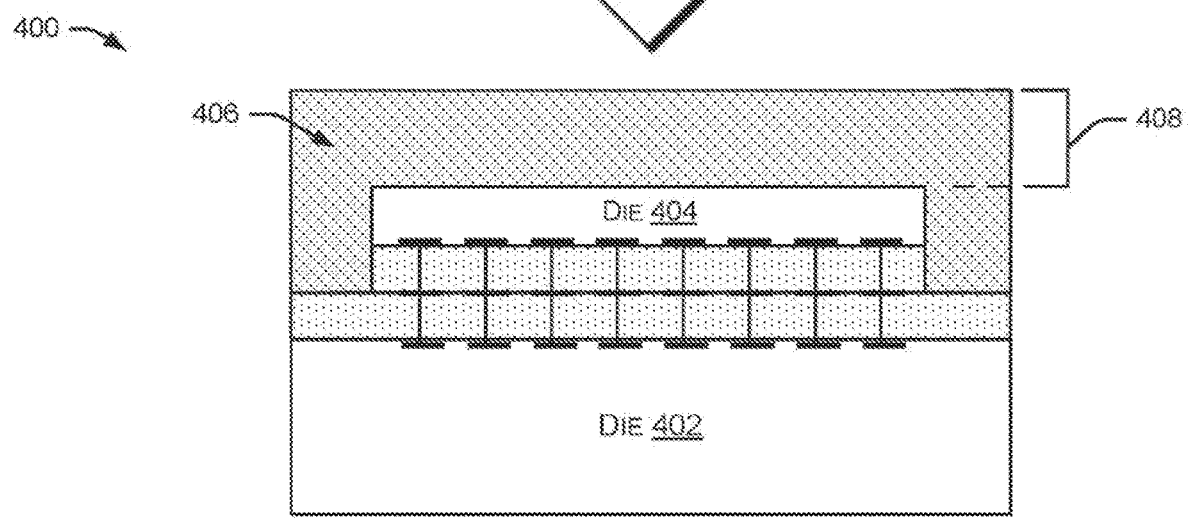
Figure 4C:
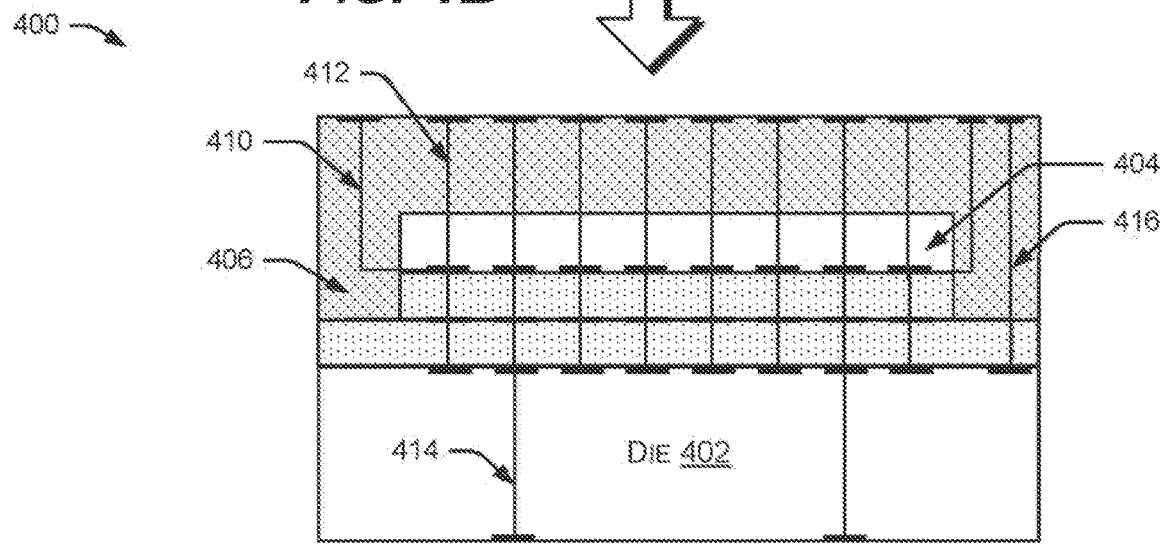

FIGS. 4A-4C show another example microelectronics package 400 with molding material between dies also encapsulating the dies or filling out package dimensions. For example, referencing FIG. 4A, first dies 402 of a first type, first footprint, and first dimensions are direct-bonded to dies 404 of a second type, second footprint, and second dimensions, with intervening dielectric bonding layers 114 and 116. The dies 402 and 404 are physically and electrically connected by direct hybrid bonding, in which the dielectric layers 114 and 116 direct-bond to each other with dielectric-to-dielectric direct bonds, and metal interconnects, pads, and/or vias direct-bond to each other across the bonding interface with metal-to-metal direct bonds.

Turning to FIG. 4B, in this embodiment, a molding material 406 is applied to at least partially fill-in spaces that occur horizontally between the second dies 404. The molding material 406 also forms a layer 408 above the top of the second dies 404, to encapsulate the dies 404, complete the package, fill a void, and/or to form a filler layer 408 for continuing fabrication of the micropackage 400 above the top of the layer 408 of the molding material 406. The molding material 406 may also fill-in vertical spaces above some dies 404 of the second layer that are shorter in vertical height than other dies 404 of the second layer. Conductive leads of the shorter second dies 404 may be extended with through-vias to a top surface of the second layer of dies 404, or to a next layer of dies, or to an outside surface of the example micropackage 400.

The molding material 406 ideally has a similar CTE as the dies 404 or dielectric 116 (or silicon) that the molding material 406 is intervening between and/or encapsulating. The molding material 406 may be a compound such as a filler material, a resist compound, silicon, a high thermal conductivity compound, formed diamond, deposited diamond, formed aluminum nitride, deposited aluminum nitride, a material with a CTE close to a CTE of silicon, a packaging material, or a board material, for example.

Turning to FIG. 4C, through vias 410 and 412 and 414 and 416 can extend from any contact pads of any of the dies 402 and 404 in the micropackage 400 to any side of the micropackage 400 for external connection, traversing through the molding material 406 as needed.

The first dies 402 and/or the molding material 406 may be thinned as needed for further layering or packaging.

Figure 5A:
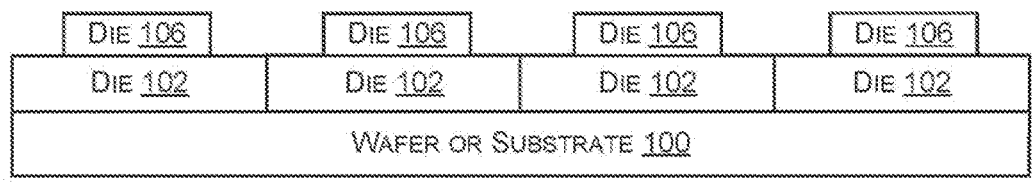
FIGS. 5A-5E are diagrams of a process for producing multilayered structures of stacked dies, wherein variegated dies of the various layers have various sizes, types, and dimensions.
Figure 5B:
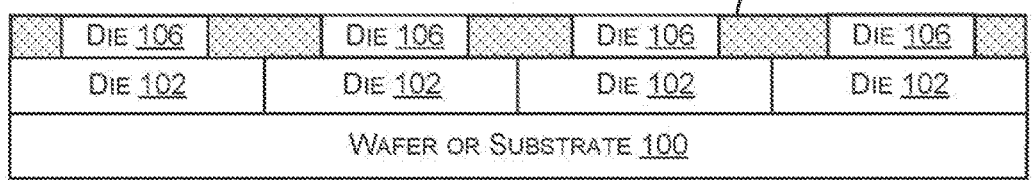
Figure 5C:
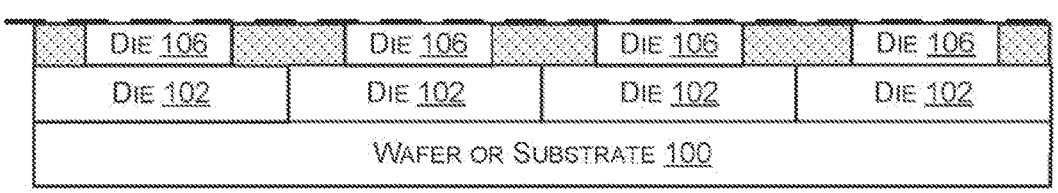

FIGS. 5A-5C show an example process for making a microelectronic device 502 with variegated dies direct-bonded in multiple layers. The variegated dies of FIGS. 5A-5C can be logic dies, image sensor dies, high bandwidth memory (HBM) dies, and so forth.

In FIG. 5A, all direct bonds or direct hybrid bonds shown between dies can be direct bonds formed between surfaces of the dies themselves, or can be direct bonds formed via one or more intervening dielectric bonding layers (not shown explicitly). The dielectric bonding layers (not shown in FIGS. 5A-5C) can contain metal interconnects or through-vias for vertically extending electrical contacts through the dielectric bonding layers. Examples of dielectric bonding layers 114 and 116 can be seen in FIGS. 1A-2C.

A substrate, carrier or wafer 100 has first dies 102, and at least some of the first dies 102 have a first footprint size and specific physical dimensions. Second dies 106 with a second footprint size and/or different physical dimensions than the footprint size and physical dimensions of the first dies 102.

Contact pads of the dies, electrical connections, interconnects, fan-out lines, redistribution traces, RDLs are not shown explicitly in FIG. 5, but leads of the dies 102 and 106 are direct-bonded together across the bonding interfaces either directly, or through vertical interconnects in dielectric bonding layers between the dies 102 and 106.

Turning to FIG. 5B, molding material 500 is placed horizontally between the dies 106 to at least partly fill the empty spaces between the dies 106.

Turning to FIG. 5C, the top surface of the second dies 106 and the molding material 500 can be planarized to make a surface for direct bonding or direct hybrid bonding another layer of variegated dies on top of the second dies 106. The planarization can be CMP to impart flatness and surface characteristics sufficient for direct bonding.

Figure 5D:
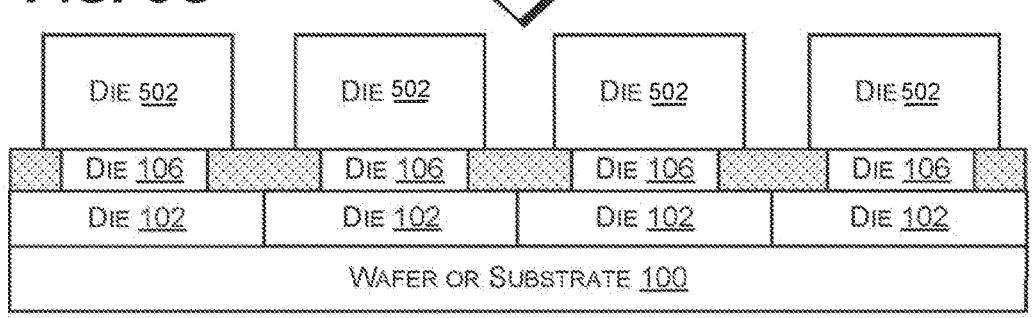

Turning to FIG. 5D, third dies 502 can be direct bonded or direct hybrid bonded to the second dies 106. The third dies 502 can be variegated dies with footprints, foundry nodes, wafer origins, functionalities, and physical dimensions different than second dies 106, and may also be different than the first dies 102. The various dies 102 and 106 and 502 do not have to be different from each other in size, footprint, foundry node, functionality, and so forth, but the example process shown in FIG. 5 makes such stacking of variegated dies 102 and 106 and 502 possible in a wafer level process.

Figure 5E:
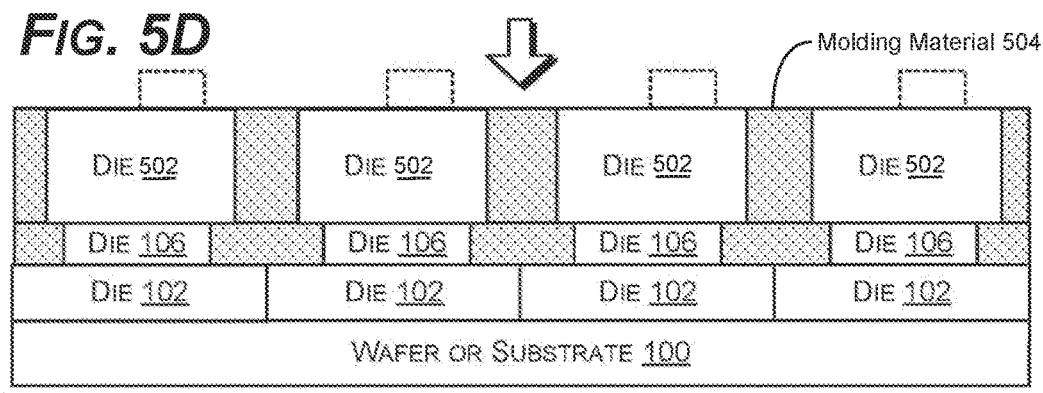

Turning to FIG. 5E, another round of molding material 504, which may be the same material or a different material than molding material used in the second layer, is applied between the third dies 502 in the third layer to at least partly fill the empty spaces horizontally between the dies 502 of the third layer. The top surfaces of the third dies 502 and the molding material 504 of the third layer are planarized to make a surface for direct bonding or direct hybrid bonding another layer of variegated dies, if desired, on top of the third layer of dies 502. The planarization can be CMP to impart flatness and surface characteristics sufficient for direct bonding.

The process can continue with direct-bonding or direct hybrid bonding of each new layer of variegated dies, filling-in intervening spaces between dies of each new layer with molding material, and then planarizing the top of the dies and the molding material for direct bonding of the next layer of dies.

Dies 102 in the first layer 104 have a front side layer of metal contacts 110 providing electrical contacts and/or redistribution traces for integrated circuits of the dies 102. The metal contacts 110 can be built up into a bonding layer with interconnects for direct-bonding to the second dies 106, or in some cases the metal contacts 110 can be bonded directly to the second dies 106 without further buildup of RDLs or further vertical extension using through-vias.

Although not shown in FIGS. 5A-5E, conductive through-vias, conductive interconnects, leads, redistribution traces, fan-outs, and RDLs can be routed in the microelectronics package, including through the molding materials 500 and/or 504, to connect the dies 502 and 506 and 514 to each other, and/or to contact pads on the outside of the microelectronics package.

FIGS. 6A-6C show different example configurations of interposer devices built according to the processes described herein. The example interposers can be used in 2.5D integrated circuit technology, for example, to provide several benefits.

First, variegated dies of various different footprint sizes, types, foundry nodes, wafer origins, physical dimensions, and so forth, can be mixed and matched not only on one side, but on both sides of an interposer substrate that is silicon, organic, or other material. The included variegated dies can be bonded together into the interposer package with direct bonding techniques instead of solder ball arrays, for example, although solder ball arrays are not excluded. The direct bonding or direct hybrid bonding can create ultra-high density routing between dies. Moreover, KGDs (known good dies) can be used to construct the example interposers, increasing production yield.

The interposers can then be reconstituted onto a semiconductor wafer, or other silicon or organic substrate, for example, or onto the package substrate of microelectronic devices making an efficient way to create such micropackages using wafer level processes to provide smaller size and higher bandwidth, and with less expensive techniques than are possible with conventional ball grid array interconnects and conventional wafer reconstitution processes.

The example interposers shown and described can help to decrease interconnection length between multiple dies assembled on the example interposers. This increases the number of interconnection routes for the interposer with stacked structure of variegated dies, saves power consumption, decreases latency, and increases bandwidth compared to conventional interposers.

Turning to FIG. 6A, a first example interposer 601 has an interposer substrate 600 with a first layer of dies 602 and a second layer of different dies 604 direct-bonded to the first layer of dies 602. A molding material 606 at least partly fills-in the spaces between the dies 604 in the second layer. The molding material 606 may also continue horizontally over the dies 604 to encapsulate the dies 604 (not shown) and complete the interposer package. The interposer 600 may use one or more RDLs 608 to distribute or fan-out traces. Interconnects and through-vias 610 can be leveraged anywhere in the package, including through the molding material 606 depending on application and need (not shown). The example through-vias 610 can also pass through the interposer substrate 600 and connect to a package substrate, to a wafer, or even to another interposer via contact pads disposed on an external surface of the interposer substrate 600, for example (not shown).

Turning to FIG. 6B, a second example interposer 611 with an interposer substrate 612 has a layer of first dies 614 of a first type, and a layer of second dies 616 of a second type direct-bonded to the first dies 614. The dies 614 and 616 may differ from each other in footprint size, functionalities, physical size, foundry node, wafer origin, and in many other specifications, but can be combined together in a wafer level process using the molding material 618 to make direct-bondable layers for making multiple levels of stacked dies 614 and 616 . . . n, in the example interposer. The interposer 611 may interface with a wafer or other devices via its interposer substrate 612 or via die 616 positioned to present front contacts of backside TSV reveals to the interface (not shown).

Turning to FIG. 6C, a third example interposer 621 has an interposer substrate 620, a layer of first dies 622 of a first type on distribution lines 623 or on one or more RDLs, for example, and a second layer of dies 624 of a second type direct-bonded to the first layer of dies 622. The dies 622 and 624 do not have to be different types, they can be the same type of die, but the example process and structures allows the dies 622 and 624 to be very different from each other. A molding material 625 fills-in spaces between dies 624 of the second layer and can also encapsulate (not shown) the dies 624 or can encapsulate (not shown) the entire top side of the interposer package 621.

On an opposing side of the interposer substrate 620, a third layer of dies 626 are bonded and electrically connected if applicable, with another molding material 627 or the same molding material used above filling in spaces between dies 626. A fourth layer of dies 628, which is the second layer on this opposing side of the interposer substrate 620 are direct-bonded to the third layer of dies 626, with another molding material 629 filling-in spaces between the dies 628 of the fourth layer and can also encapsulate (not shown) the dies 628 or can encapsulate (not shown) the entire bottom side of the interposer package 621. Through-vias, distribution traces, and contact pads can be disposed anywhere in, or on the outside of the interposer package 621, traversing any of the molding material 625 and 627 and 629 as needed for routing. Thus, the interposer package 621 can interface with a wafer or other devices via either top or bottom connections, or both.

The example interposers 601 and 611 and 621 can be used to make HBMs, with high density routing. Memory dies can be stacked on the interposers along with dies providing the main processor and HBM controller. The example interposers 601 and 611 and 621 can also be used for other high performance computing applications, artificial intelligence (AI), graphic processors, image sensors, and other applications.

Example Image Sensor Structures and Processes

Example image sensor devices are now described as example embodiments of the stacked die structures and associated processes shown and described above in FIGS. 1A-6C. Both backside illuminated and front-side illuminated image sensors and associated methods of fabrication are described using the processes of making stacked die structures of FIGS. 1A-6C.

Front-side illumination refers to light entering photo diode elements through a back-end-of-line (BEOL) layer of metal wiring built on the front side of the photo diode elements. A bond interface with a logic chip is on the backside of the photo diode elements die, faced away from the incoming light. Back-side illumination refers to light entering the photo diode elements on the side of the backside of the photo diode elements die, with the BEOL metal wiring layer on the opposing front side of the photo elements die. The BEOL metal wiring layer (on the front side, away from the incoming light) faces the bond interface with the logic chip.

This disclosure is not limited to the use of image sensor wafers and is more generally applicable to semiconductor wafers, for example complementary metal-oxide-semiconductor (CMOS) wafers, which have a BEOL front side disposed on an active device layer which can be facing toward or away from a bond interface.

Figure 7A:
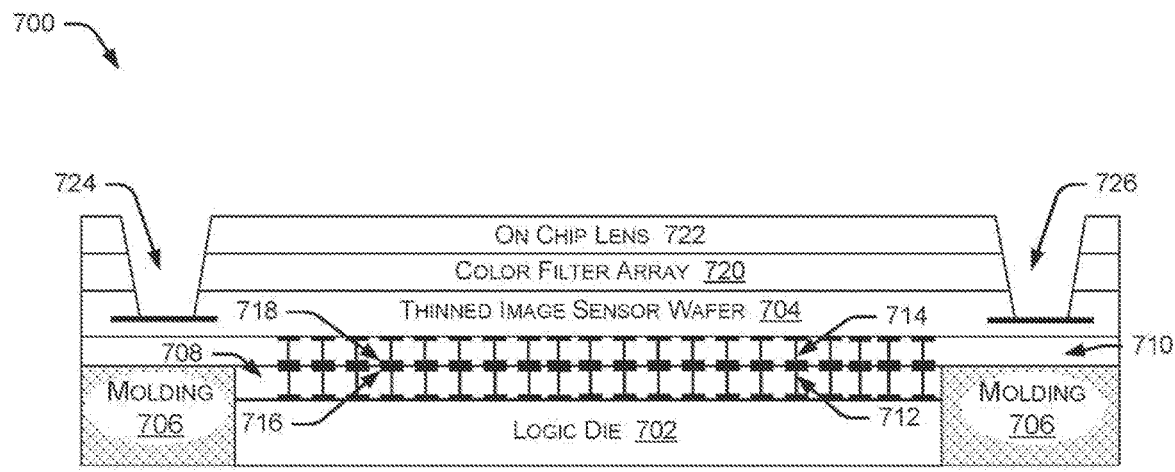
FIGS. 7A and 7B are diagrams of a first example backside illuminated image sensor structure.

FIG. 7A is a diagram of a first example backside illuminated image sensor structure 700. Generally, the example backside illuminated image sensor structure 700 can be made by direct hybrid bonding of logic dies 702 of a first footprint size, to a front side of an image sensor wafer 704 in a D2 W process, and optionally filling-in spaces between the logic dies 702, either fully or partly, with a molding compound 706, a resist material, a silicon spacer material, glass, or a thermally conductive compound, for example. The direct hybrid bonding between photo diode element dies on the image sensor wafer 704 and the logic dies 702 may be intermediated by dielectric layers 708 and 710 with through-vias 712 and 714 and contact pads 716 and 718 suitable for direct hybrid bonding.

The image sensor wafer 704 may be a 200 millimeter wafer, or of other size, and the logic dies 702 can also be of various sizes, for example logic dies 702 from a 300 millimeter wafer, for example.

The direct hybrid bonding can be a direct bond interconnect (DBI®) hybrid bonding process, for example, or other process that direct-bonds dielectric surfaces together while direct-bonding the metal contact pads 716 and 718 together in steps of the same direct-bonding operation.

A support carrier (not shown in FIGS. 7A and 7B) may optionally be direct bonded to at least the logic dies 702 using an intervening dielectric, for example. Imaging layers such as a color filter array 720 and on-chip lens 722, for example, may be deposited, bonded or direct-bonded to the image sensor wafer 704.

Last metal contact pads 724 and 726 may be etched out to make package interconnects, or other interconnect methodologies may be implemented through routing lines and through-vias, including routing lines and through-vias directed through the molding material 706.

An example process for making the example backside illuminated image sensor structure 700 includes obtaining an image sensor wafer 704 that has photo-diode arrays or pixel arrays, the arrays of a first size. The example process creates microcircuits and bonding pads on a front-side of the image sensor wafer 704, the bonding pads suitable for direct hybrid bonding. The process continues with obtaining a logic die 702 of a second size, for example, the second size can be smaller than the first size of the photo-diode arrays or the pixel arrays of the image sensor wafer 704. Microcircuits and bonding pads for direct hybrid bonding are also made on the logic die 702.

Next, the example process joins the logic die 702 to at least one photo-diode array or pixel array of the image sensor wafer 704 with a hybrid bonding technique to form a mechanical and electrical connection between the bonding pads of the logic die 702 and the bonding pads of the image sensor wafer 704.

The molding material 706 may be added to extend the logic die, which may have a variety of sizes, to match the larger size of the photo-diode array or pixel array when needed, or to partially or fully fill in horizontal spaces in the horizontal layer containing the logic die(s) 702. The molding material 706 can be a molding compound, passive silicon, a glass, a thermally conductive material, or other suitable material. The filler material may also be formed or deposited diamond, formed or deposited aluminum nitride, a material with a CTE close to a CTE of silicon, a packaging material, and a board material, for example. The molding material 706 may have a high thermal conductivity, and may extend below the logic dies 702 to dissipate heat and hot spots in the image sensor wafer 704 (not shown). The molding material 706 may also extend below the logic dies 702 to add mechanical strength to the layer of the logic dies 702 (not shown). If passive or dummy silicon is the filler material, the silicon may be applied as a spin coating, for example.

Figure 7B:
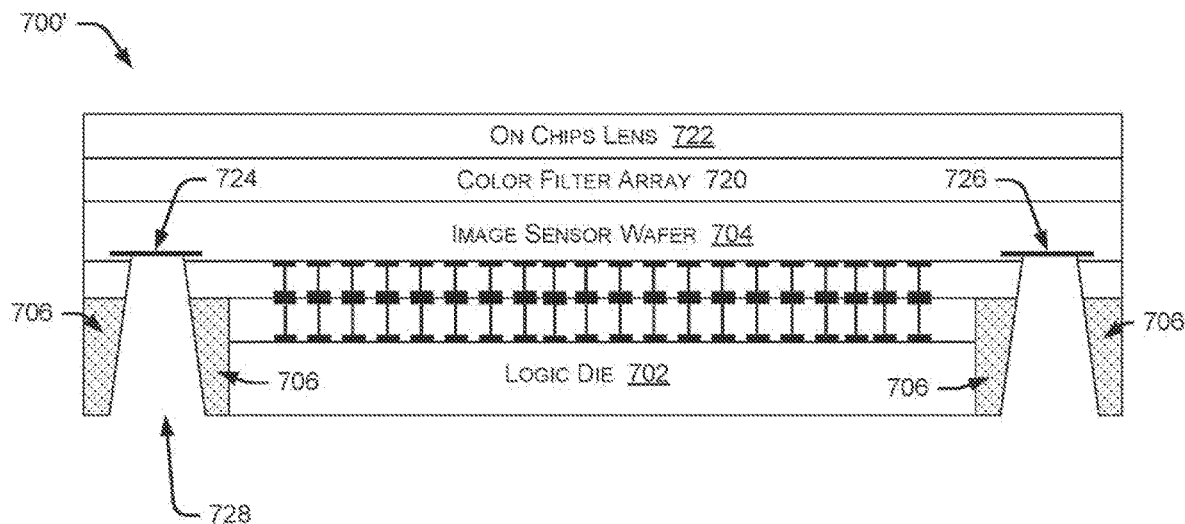

FIG. 7B illustrates a structure 700' that shows a variation of the example backside illuminated image sensor package 700, in which access to the bonding pads 726 and 726 is obtained through vias created on the front side of the image sensor package 700'.

In the example process, the joining may direct-bond logic dies 702 of one size, from a 300 millimeter wafer, for example, to image sensors 704 on a 200 millimeter image sensor wafer 704, for example. The direct-bonding can additionally be a direct hybrid bonding process, such as a DBI® hybrid bonding process for fine-pitch hybrid bonding. The bonding can also be a direct oxide bonding process, such as oxide bonding in the context of TSVs, for the electrical interconnects. A suitable example oxide bonding technique for this scenario can be a ZiBond® direct oxide bonding process, for example, or another direct-bonding process. The photo-diode arrays or pixel arrays of the image sensor wafer 704 may comprise CMOS image sensors (CIS), or other types of image sensors.

The logic dies 702 may include logic driver circuitry or memory, such as DRAM, or both logic driver circuitry and DRAM memory for the photo-diode arrays or pixel arrays. The photo-diode arrays or pixel arrays are on a backside of the image sensor wafer 704 for BSI implementations, and the example process may include thinning the backside of the image sensor wafer 704.

The example process continues with depositing the color filter array 720 and an on-chip lens 722 onto the thinned backside of the image sensor wafer 704. Then, the process includes creating openings to the contact pads 724 and 726 of the photo-diode arrays or pixel arrays through a backside of the image sensor wafer 704. The contact pads 724 and 726 are usually chip-to-package bonding sites. In a variation, openings to the bonding pads 724 and 726 can also be made from the front-side 728 of the image sensor package, in example backside illuminated image sensor structure 700'. In structure 700', the openings to the contact pads 724 and 726 are made through the molding material 706 to the front-side 728 of the image sensor wafer 704. In another implementation, the openings to the contact pads 724 and 726 are made through a bond via array (BVA) process.

Figure 8A:
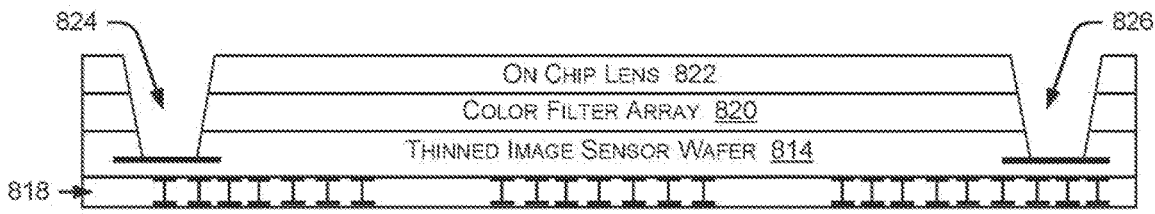
FIGS. 8A-8C are diagrams of a second example backside illuminated image sensor structure.
Figure 8B:
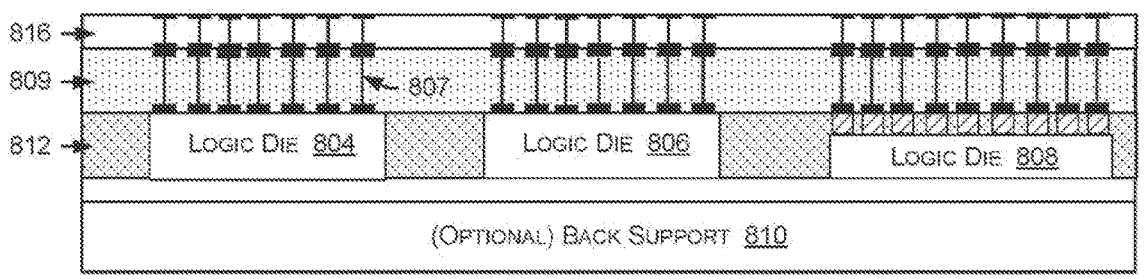
Figure 8C:
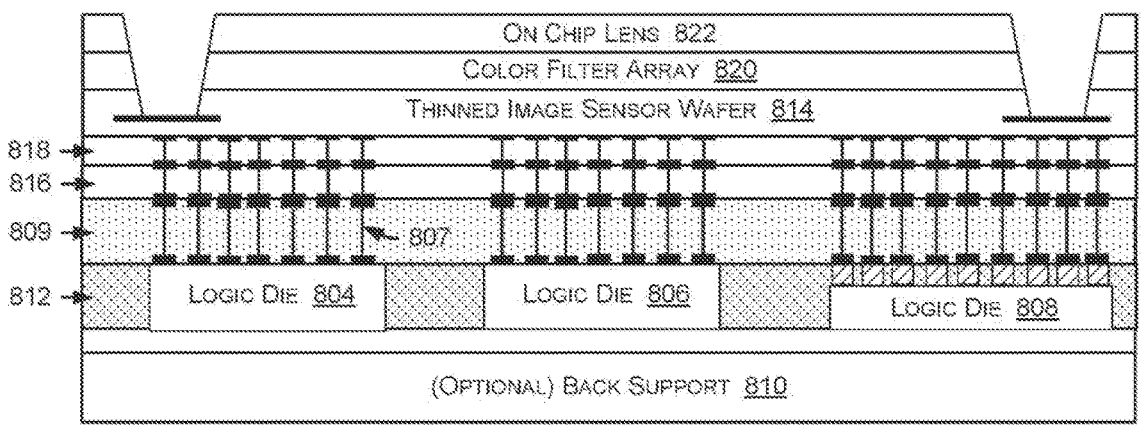

FIG. 8C shows a second example backside illuminated image sensor structure 801, comprising a reconstituted wafer 800 and an image sensor portion 802 of the package. At FIG. 8B, the reconstituted wafer 800 is fabricated by bonding logic dies 804 and 806 and vertically shorter logic die 808, for example, to a carrier wafer 809. The logic dies 804 and 806 and 808 and carrier 809 may optionally be bonded or adhered to a back support 810 for extra strength if desired. Horizontal spaces between the logic dies 804 and 806 and 808 are at least partially filled with a molding material 812. A direct hybrid bonding layer 816 of dielectric material and metal interconnects tops off the reconstituted logic package 800.

Turning to FIG. 8C, in an image sensor portion 802 of the package, an image sensor wafer 814 of optionally different size and foundry origin than the logic dies 804 and 806 and 808 is surmounted by a color filter array 820, and an on chip lens 822. The image sensor wafer 814 is thinned, and a direct hybrid bonding layer 818 of dielectric and metal interconnects is added. The reconstituted logic part of the package 800 and the image sensor portion of the package 802 are now direct hybrid bonded together to make the backside illuminated image sensor. Bond pads of the thinned image sensor wafer 814 are exposed for connection to a microelectronic device.

Turning to FIG. 8C, an example process for making the example backside illuminated image sensor structure 800 and 802 includes creating conductive vias 807 in the carrier wafer 809, bonding the logic dies 804 and 806 and 808 of a first footprint size, such as dies from a 300 millimeter wafer, to the conductive vias 807 of the carrier wafer 809 using direct hybrid bonding or a surface mount technology, adding the molding material 812 between the logic dies 804 and 806 and 808 to make a reconstituted logic wafer 800 on the carrier wafer 809, thinning the carrier wafer 809 to expose the conductive vias 807 on an opposing side of the carrier wafer 809, and adding a direct bonding layer 816 to the exposed conductive vias 807 of the carrier wafer 809. An optional back support wafer 810 may be attached to the reconstituted logic wafer. The example process further includes adding a direct bonding layer 818 to an image sensor wafer 814, and then joining the reconstituted logic wafer 800 to the image sensor wafer 802 by bonding the respective direct hybrid bonding layers 816 and 818 to each other.

At this point, the example process then includes thinning a backside of the image sensor wafer 814, and depositing a color filter array 820 and an on-chip lens 822 on the thinned backside of the image sensor wafer 814. The process then opens vias to contact pads 824 and 826 of the image sensor wafer 814 through the color filter array 820 and the on-chip lens 822.

The molding material 812 may be a mold compound, a resist compound, silicon, a high thermal conductivity compound, formed or deposited diamond, formed or deposited aluminum nitride, a material with CTE close to a CTE of silicon, a packaging material, and a board material. The molding material may have a high thermal conductivity and may extend below the logic dies 804 and 806 and 808 to dissipate heat and hot spots in the thinned image sensor wafer 814 (not shown). The molding material 812 may also extend below the logic dies 804 and 806 and 808 to add a mechanical strength to the layer of the logic dies 804 and 806 and 808 (not shown).

Figure 9:
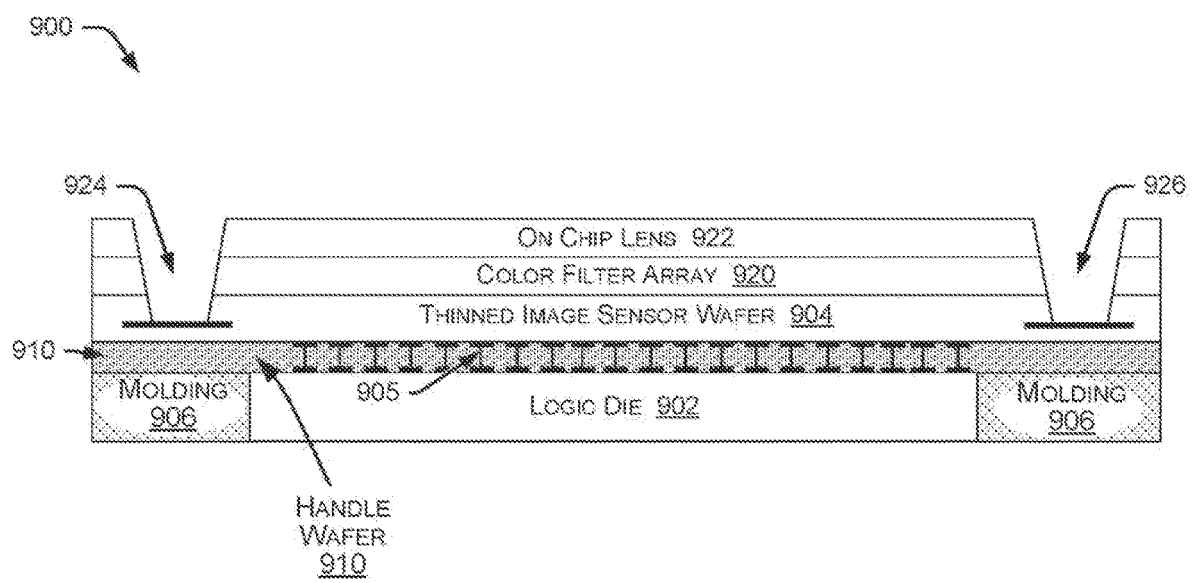
FIG. 9 is a diagram of a third example backside illuminated image sensor structure.

FIG. 9 shows another example backside illuminated image sensor structure 900. This example structure 900 attaches logic dies 902 to a thinned handle wafer 910 during fabrication. Handle wafer 910 may also or alternatively be thinned after logic die 902 attachment. The example process creates TSVs 905 through the handle wafer 910 for coupling the logic dies 902 to the thinned image sensor wafer 904. Additionally or alternatively, the TSVs 905 may be formed by a via first, via middle, or via last process and some or all of the interconnections could be made by more traditional means, including through the use of solder connections.

An example process for making the example backside illuminated image sensor structure 900 of FIG. 9 includes planarizing the image sensor wafer 904 to make a thinned image sensor wafer 904 that has chip-to-package conductive contact pads 924 and 926 and has conductive bonding pads for connection to the logic dies 902. The process direct-bonds a front-side of the thinned image sensor wafer 904 to a first handle wafer 910, attaching a temporary second handle wafer (not shown) to a backside of the thinned image sensor wafer 904 using a temporary dielectric layer that is direct-bonded between a backside of the thinned image sensor wafer 904 and the temporary second handle wafer. Image sensor wafer 904 may also or alternatively be thinned after direct-bonding to the first handle wafer 910. The process thins the first handle wafer 910 attached to the front-side of the thinned image sensor wafer 904, and creates the conductive TSVs 905 through the thinned first handle wafer 910, with first ends of the TSVs 905 conductively coupled to the bonding pads of the image sensor wafer 904. The process adds a layer of bonding pads to second ends of the TSVs 905, then direct-bonds the logic dies 902 to the bonding pads on the thinned first handle wafer 910. The process adds a molding compound 906, resist material, or silicon spacers in the horizontal spaces around the logic dies 902, then removes the temporary first handle wafer (not shown) and the temporary dielectric layer from the backside of the thinned image sensor wafer 904. The process exposes the conductive contact pads 924 and 926 of the thinned image sensor wafer 904 from the backside of the thinned image sensor wafer 904, and then deposits a color filter array 920 and an on-chip lens 922 onto the backside of the thinned image sensor wafer 904. Conductive contact pads 924 and 926 of the thinned image sensor wafer 904 may alternatively be exposed after deposition of the color filter array 920 and/or on-chip lens 922.

The thinned image sensor wafer 904 may be a 200 millimeter wafer, and the logic dies can be from a 300 millimeter wafer, for example.

For bonding techniques, the example process may include direct hybrid bonding the logic dies 902 to the layer of bonding pads on the thinned first handle wafer 910. The direct hybrid bonding may be DBI® brand of direct hybrid bonding, for example. The example process may include direct hybrid bonding the first ends of the TSVs 905 to the bonding pads of the image sensor wafer 904. The temporary dielectric layer can be direct bonded between the backside of the thinned image sensor wafer 904 and the temporary second handle wafer (not shown) using a ZiBond® direct bonding process, for example.

In an implementation, the image sensor wafer 904 has a 3-10 micron thickness of silicon and less than a 5 micron thickness of BEOL layers. The first handle wafer 910 can either be thinned to greater than approximately 10 microns for greater downstream mechanical integrity or thinned to less than approximately 10 microns for simplifying subsequent processing.

The second handle wafer (not shown) can be a 200 millimeter wafer with an initial thickness of approximately 750 microns. A layer containing the logic dies and the molding compound, the resist material or silicon spacers can be greater than 50 microns thick. The molding compound 906 can be a mold material, a resist compound, silicon, a high thermal conductivity compound, formed or deposited diamond, formed or deposited aluminum nitride, a material with a CTE close to a CTE of silicon, a packaging material, and a board material. The molding compound 906 may have a high thermal conductivity and may extend below the logic dies 902 in order to dissipate heat and hot spots in the thinned image sensor wafer 904 (not shown). The molding compound 906 may also extend below the logic dies 902 to add mechanical strength to the layer of the logic dies 902 (not shown).

Figure 10A:
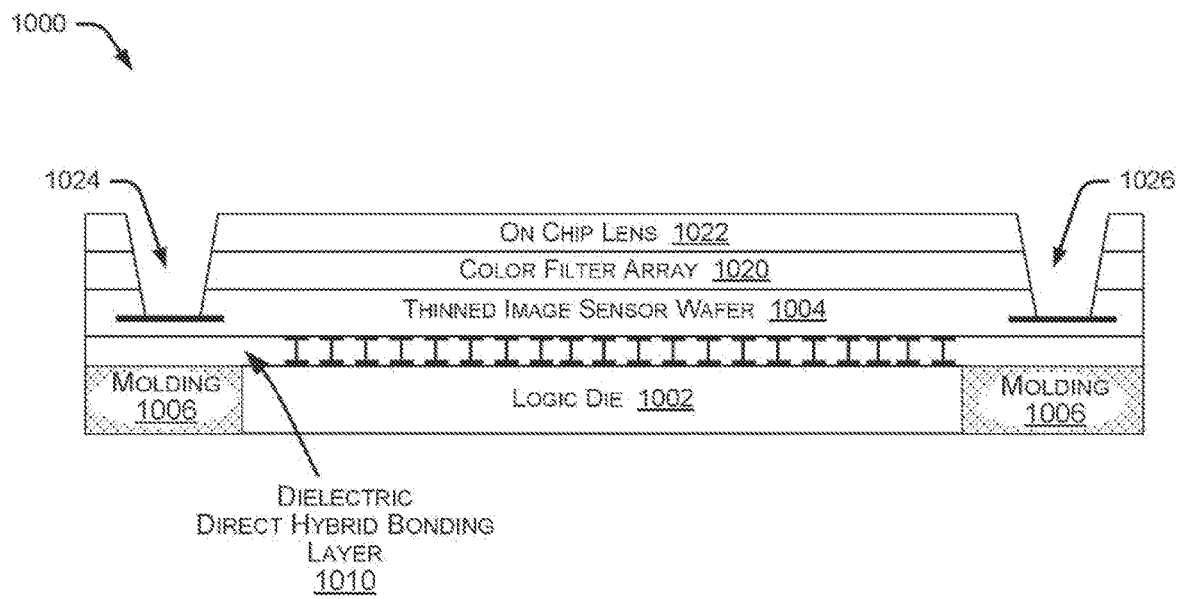
FIGS. 10A and 10B are diagrams of a fourth example backside illuminated image sensor structure.

FIG. 10A and/or 10B shows another example backside illuminated image sensor structure 1000, which features fabrication using a temporary image sensor handle wafer, without a permanently incorporated handle wafer 910 of FIG. 9.

An example process for making the image sensor structure 1000 of FIG. 10A and/or 10B includes planarizing an image sensor wafer 1004 to make a thinned image sensor wafer 1004, wherein the thinned image sensor wafer has chip-to-package conductive contact pads 1024 and 1026 and has conductive bonding pads for connection to logic dies 1002. The process direct-bonds a front-side of the thinned image sensor wafer 1004 to a first handle wafer (not shown) via a first dielectric layer (not shown), then direct-bonds the backside of the thinned image sensor wafer 1004 to a second handle wafer (not shown) via a second dielectric layer. The process removes the first handle wafer from the front side of the thinned image sensor wafer 1004 while leaving the first dielectric layer in place, adding direct hybrid bond conductors and through dielectric vias (TDVs) 1005 to the first dielectric layer to convert the first dielectric layer to a direct hybrid bonding layer 1010. The process bonds logic dies 1002 to the direct hybrid bonding layer 1010 via direct hybrid bonds, and adds a molding compound 1006 into the horizontal spaces around the logic dies 1002. The molding compound 1006 can be a filler, a resist material, or silicon spacers, for example. The process then removes the second handle wafer (not shown) and the second dielectric layer from the backside of the thinned image sensor wafer 1004, and exposes the conductive contact pads 1024 and 1026 of the thinned image sensor wafer 1004 from the backside of the thinned image sensor wafer 1004. The process deposits a color filter array 1020 and an on-chip lens 1022 onto the backside of the thinned image sensor wafer 1004.

The thinned image sensor wafer 1004 can be a 200 millimeter wafer, and the logic dies 1002 may be diced from a 300 millimeter wafer, for example.

Figure 10B:
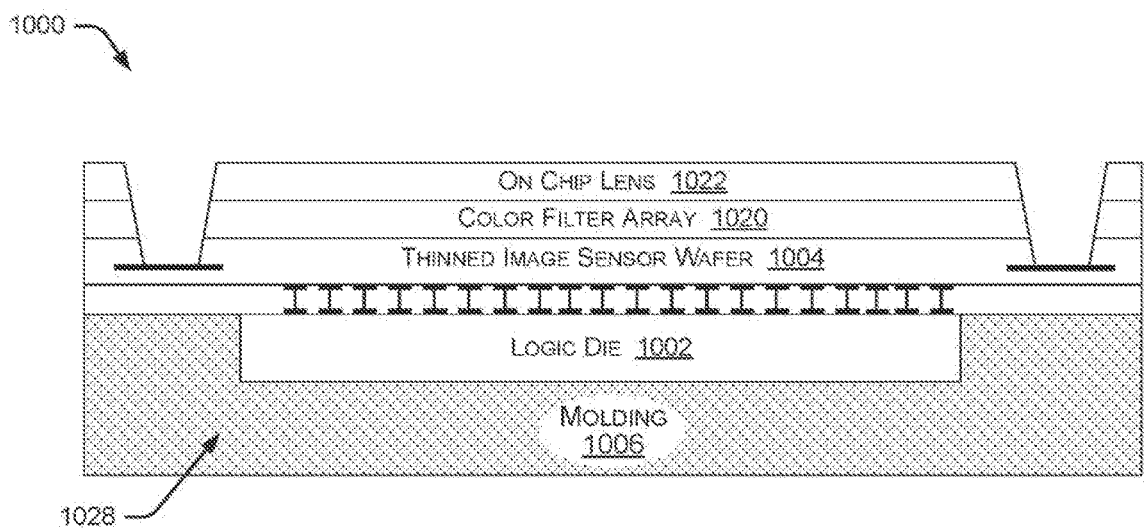

The molding compound 1006 can be a filler material, a resist compound, silicon, a high thermal conductivity compound, formed or deposited diamond, formed or deposited aluminum nitride, a material with a CTE close to a CTE of silicon, a packaging material, and a board material. The molding compound 1006 can have a high thermal conductivity and may extend below the logic dies 1002 as shown in FIG. 10B at 1028 to dissipate heat and hot spots in the thinned image sensor wafer 1004, and/or provide mechanical strength to the layer of logic dies 1002.

Figure 11:
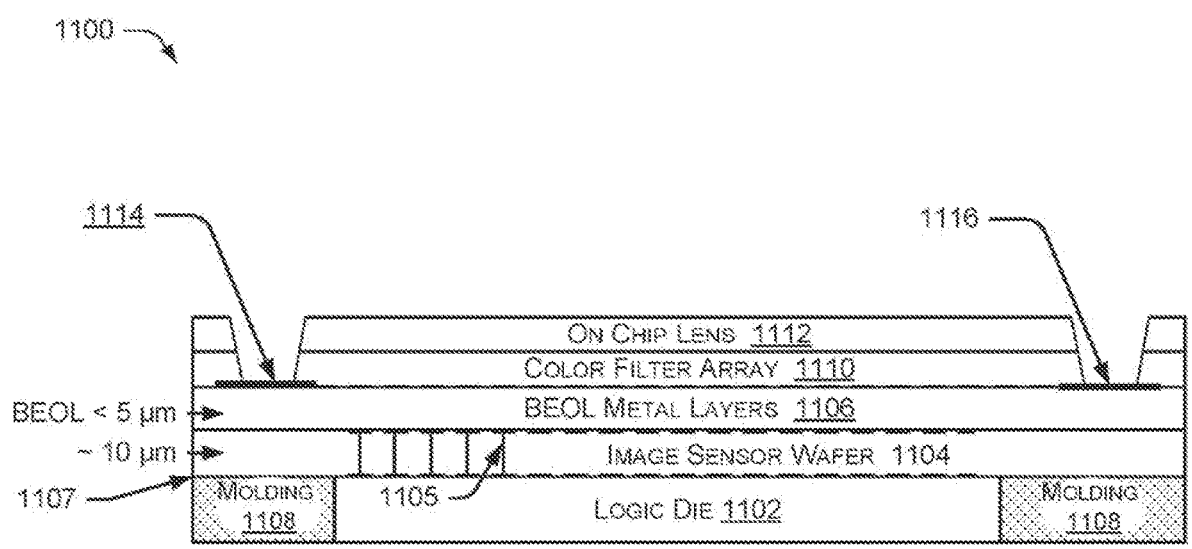
FIG. 11 is a diagram of a first example front-side illuminated image sensor structure.

FIG. 11 shows a first example of a front-side illuminated image sensor structure 1100, made via the example processes described with respect to FIGS. 1-6. FIG. 11 can be distinguished from the sensor structures of FIGS. 7A-10B, which are backside illuminated sensor structures. In the front-side illuminated image sensor structure 1100 of FIG. 11, light shines through BEOL metal layers 1106 on a front side of an image sensor wafer 1104.

An example process for fabricating the example front-side illuminated image sensor structure 1100 includes building back-end-of-line (BEOL) layers 1106 on a front side of an image sensor wafer 1104, direct-bonding a handle wafer (not shown) onto the BEOL layers via a dielectric layer (not shown), thinning a backside of the image sensor wafer 1104 to approximately 10 microns, for example; creating through-vias 1105 through the thinned image sensor wafer 1104, building a direct hybrid bond layer 1107 conductively coupled with ends of the TSVs 1105 on the backside of the thinned image sensor wafer 1104, and direct hybrid bonding logic dies 1102 to the direct hybrid bonding layer 1107.

The example process further continues with adding a filler or molding material 1108 around the logic dies 1102. The filler material can be a mold material 1108, a resist compound, silicon, a high thermal conductivity compound, formed or deposited diamond, formed or deposited aluminum nitride, a material with a CTE close to a CTE of silicon, a packaging material, and a board material. The filler material 1108 may have a high thermal conductivity and may extend below the logic dies 1102 to dissipate heat and hot spots in the thinned image sensor wafer 1104 and/or provide mechanical strength to the layer of logic dies 1102 (not shown).

The example process continues with removing the handle layer (not shown) and the dielectric (not shown) layer from the (top of the) BEOL layers 1106, opening contact pads 1114 and 1116 of the BEOL layers 1106 from a front side of the BEOL layers 1106, and depositing a color filter array 1110 and an on-chip lens 1112 to the BEOL layers 1106 to complete a front side illuminated image sensor structure 1100 with logic dies 1102 direct hybrid bonded to the backside of the thinned image sensor wafer 1104.

The thinned image sensor wafer 1104 can be a 200 millimeter wafer, and the logic dies can be from a 300 millimeter wafer, for example. A thickness for the logic dies 1102 can be selected that provides sufficient mechanical strength for the package, e.g., front-side illuminated image sensor structure 1100.

Figure 12:
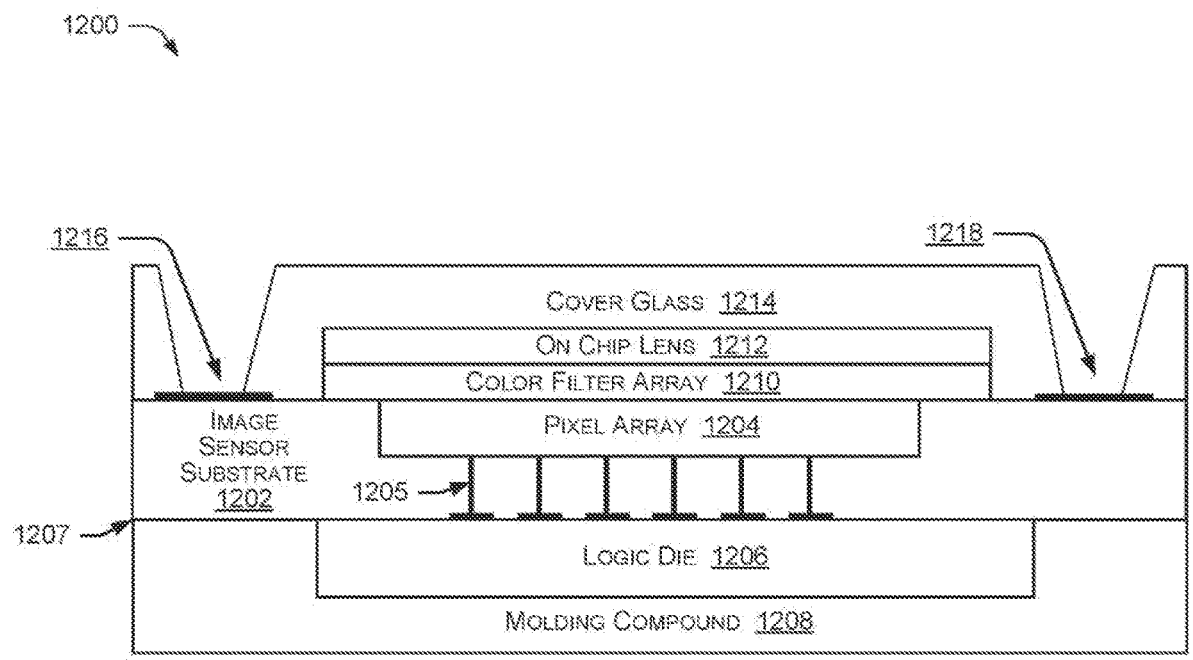
FIG. 12 is a diagram of a second example front-side illuminated image sensor structure.

FIG. 12 shows a second example front-side illuminated image sensor structure 1200. This implementation of a front-side illuminated image sensor structure 1200 uses molding material 1208 to fill-in packaging around logic dies 1206 of one size, bonded to image sensor substrates 1202 and pixel arrays 1204 of different sizes, all in a wafer level production process.

An example process making the front-side illuminated image sensor structure 1200 of FIG. 12 includes bonding a color filter array 1210 and on-chip lens 1212 to a front side of a pixel array 1204 on an image sensor substrate 1202 and then adding a cover glass 1214 over the on-chip lens 1212.

The example process then thins the backside of the image sensor substrate 1202, and creates though-vias 1205 and a direct hybrid bonding layer 1207 on the backside of the image sensor substrate 1202. The process attached logic dies 1206 to the direct hybrid bonding layer 1207 on the backside of the image sensor substrate 1202, and adds molding material 1208 or a high strength thermally conductive material laterally to the logic die 1206 and to the lateral edges of the image sensor substrate 1202. The molding material 1208 or the high strength thermally conductive material can extend in a layer below the logic dies 1206.

The thinned image sensor substrate 1202 can be from a 200 millimeter image sensor wafer, and the logic dies 1206 can be from a 300 millimeter wafer, for example. Contact pads 1216 and 1218 for package bonding are opened from the front side of the device.

Example Methods

Figure 13:
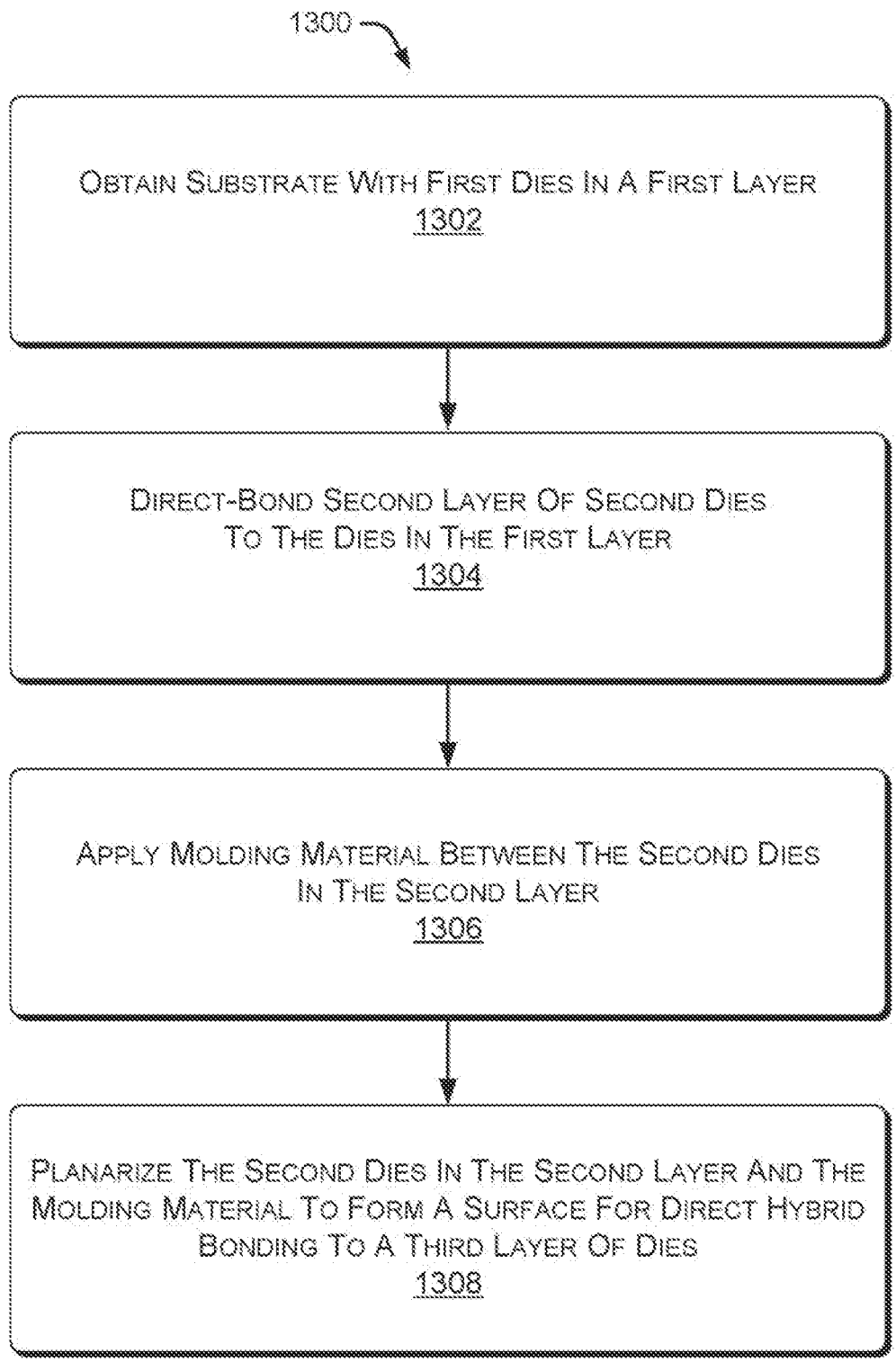
FIG. 13 is a flow diagram of an example method of fabricating direct-bonded stacked die structures in a wafer level process.

FIG. 13 shows an example method 1300 of fabricating direct-bonded stacked die structures in a wafer level process. Operations of the example method 1300 are shown in individual blocks.

At block 1302, a substrate with first dies in a first layer is obtained.

At block 1304, a second layer of second dies is direct-bonded to the first dies in the first layer.

At block 1306, a molding material is applied between the second dies in the second layer.

At block 1308, the second dies in the second layer, and the molding material, are planarized to form a surface suitable for direct hybrid bonding to a third layer of dies.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific dimensions, quantities, material types, fabrication steps and the like can be different from those described above in alternative embodiments. The term "coupled" is used herein to express a direct connection as well as a connection through one or more intervening circuits or structures. The terms "example," "embodiment," and "implementation" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

While the present disclosure has been disclosed with respect to a limited number of embodiments, those skilled in the art, having the benefit of this disclosure, will appreciate numerous modifications and variations possible given the description. It is intended that the appended claims cover such modifications and variations as fall within the true spirit and scope of the disclosure.

What is claimed is:

1. A method of forming a bonded sensor structure, the method comprising:
   bonding a first side of a connecting wafer to a second side of a sensor wafer to form a first bonded structure having a first side with the sensor wafer and a second side opposite the first side;
   hybrid bonding the second side of the first bonded structure to a first side of a logic element;
   after hybrid bonding the second side of the first bonded structure to the first side of the logic element, processing a first side of the sensor wafer opposite the second side of the sensor wafer, wherein processing the first side of the sensor wafer includes providing optical features over the first side of the sensor wafer to form the bonded sensor structure; and
   opening contacts to the bonded sensor structure.

2. The method of claim 1, wherein bonding the first side of the connecting wafer to the second side of the sensor wafer comprises wafer-to-wafer bonding.

3. The method of claim 1, wherein hybrid bonding the second side of the wafer to the first side of a logic element comprises hybrid bonding a logic die to the second side of the wafer, further comprising depositing an insulating material on sides of the logic die.

4. The method of claim 1, wherein the connecting wafer comprises a first handle wafer, further comprising:
   bonding a first side of the sensor wafer to a second handle wafer; and
   removing the second handle wafer from the first side of the sensor wafer after hybrid bonding the second side of the first handle wafer to the logic element.

5. The method of claim 1, wherein processing the first side of the sensor wafer further comprises thinning the sensor wafer after bonding the first side of the connecting wafer to the second side of the sensor wafer.

6. The method of claim 5, wherein providing optical features over the first side of the sensor wafer comprises depositing a filter array.

7. The method of claim 6, wherein providing optical features over the first side of the sensor wafer further comprises depositing an on-chip lens.

8. The method of claim 1, wherein hybrid bonding the second side of the connecting wafer to the first side of the logic element comprises hybrid bonding the second side of the connecting wafer to a logic die.

9. The method of claim 8, wherein hybrid bonding the second side of the connecting wafer to the first side of the logic element further comprises hybrid bonding the second side of the connecting wafer to a plurality of logic dies and depositing an insulating material between logic dies of the plurality.

10. The method of claim 1, further comprising thinning the connecting wafer after bonding the first side of the connecting wafer to the second side of the sensor wafer.

11. The method of claim 10, further comprising providing electrical connections between the first side of the logic element and the second side of the sensor wafer through the connecting wafer.

12. The method of claim 11, further comprising providing a layer of bonding pads as part of the electrical connections.

13. The method of claim 1, wherein opening contacts comprises opening contacts from the first side of the sensor wafer.

* * * * *